United States Patent
Mitani et al.

(10) Patent No.: US 7,475,165 B2
(45) Date of Patent: Jan. 6, 2009

(54) SEMICONDUCTOR DATA STORAGE APPARATUS

(75) Inventors: Kinji Mitani, Higashimurayama (JP); Shigemasa Shiota, Tachikawa (JP); Hiroyuki Goto, Higashimurayama (JP); Hirofumi Shibuya, Matsuda (JP); Fumio Hara, Higashikurume (JP)

(73) Assignee: Renesas Technology Corp., Tokyo (JP)

( * ) Notice: Subject to any disclaimer, the term of this patent is extended or adjusted under 35 U.S.C. 154(b) by 663 days.

(21) Appl. No.: 11/058,254

(22) Filed: Feb. 16, 2005

(65) Prior Publication Data

US 2005/0185488 A1    Aug. 25, 2005

(30) Foreign Application Priority Data

Feb. 20, 2004    (JP)    ............................. 2004-044051

(51) Int. Cl.
*G06F 13/10* (2006.01)
(52) U.S. Cl. .......................................... 710/14; 710/74
(58) Field of Classification Search ........................ None
See application file for complete search history.

(56) References Cited

U.S. PATENT DOCUMENTS 4,766,294 A * 8/1988 Nara et al. .................. 235/380
4,812,634 A * 3/1989 Ohta et al. .................. 235/492

FOREIGN PATENT DOCUMENTS

JP    07-176698    7/1995
JP    10-106276    4/1998

* cited by examiner

*Primary Examiner*—Ilwoo Park
(74) *Attorney, Agent, or Firm*—Miles & Stockbridge P.C.

(57) ABSTRACT

Production cost for a semiconductor data storage apparatus is significantly reduced by using the same controller to support an external analog module and an internal analog module. In a data processing system, a controller is provided with switching elements composed of fuses. Switching between the external analog module composed of an external power supply circuit, an external power supply monitor circuit, and a clock generator element and the internal analog module composed of an internal power supply circuit, an internal power supply monitor circuit, and a self-excited oscillator circuit is performed by arbitrarily disconnecting the fuses. For example, when an internal power supply voltage Vdd1 generated by the external power supply monitor circuit is supplied to the controller or the like, the fuse is disconnected. Thus, measures can be taken in accordance with a purpose by, e.g., selecting the external analog module when an interleave operation is used.

10 Claims, 24 Drawing Sheets

|  |  | POWER SUPPLY CIRCUIT | POWER SUPPLY MONITOR CIRCUIT | CLOCK GENERATOR CIRCUIT |
|---|---|---|---|---|
| C1 | 1 | EXTERNAL | – | – |
|  | 0 | INTERNAL | – | – |
| C2 | 1 | – | EXTERNAL | – |
|  | 0 | – | INTERNAL | – |
| C3 | 1 | – | – | EXTERNAL |
|  | 0 | – | – | INTERNAL |

SEMICONDUCTOR DATA STORAGE APPARATUS

CROSS-REFERENCE TO RELATED APPLICATION

The present application claims priority from Japanese patent application No. 2004-044051 filed on Feb. 20, 2004, the content of which is hereby incorporated by reference into this application.

BACKGROUND OF THE INVENTION

The present invention relates to a technology for reducing cost for a semiconductor data storage apparatus and, more particularly, to a technology which is effective when applied to cost reduction for a memory card using a nonvolatile memory.

As external memory media for a personal computer, a multi-function terminal, and the like, there have been widely known semiconductor data storage apparatus such as a CF (Compact Flash) card, smart media, a memory stick, and a multimedia card.

In general, a semiconductor data storage apparatus comes in various versions prepared for different purposes, which include a low-price version, a standard version, and a high-reliability/high-value-added version with an increased added value. In the low-price version, for example, an analog module including a power supply circuit, a clock generator circuit, and a power supply monitor circuit has preliminarily been mounted on a controller, thereby achieving cost reduction.

In the semiconductor data storage apparatus in the high-reliability version, on the other hand, a power supply circuit, a clock generator circuit, a power supply monitor circuit, and the like are not mounted on a controller but formed as an external analog module, thus providing a structure which further enhances reliability.

In the semiconductor data storage apparatus in the standard version, some of a power supply circuit, a clock generator circuit, a power supply monitor circuit, and the like are formed as an internal analog module which is mounted on a controller, while the others are formed as an external analog module, thereby providing a structure which offers a balance between cost and reliability.

Examples in which power supply circuits in nonvolatile semiconductor memories of this type are described in detail include one in which plural types of internal voltages are generated (Patent Document 1) and one in which trimming means for the pulse width of a write voltage is provided (Patent Document 2).

[Patent Document 1] Japanese Laid-Open Patent Publication No. Hei 07(1995)-176698 (U.S. Pat. No. 5,553,021)

[Patent Document 2] Japanese Laid-Open Patent Publication No. Hei 10(1998)-106276 (U. S. Pat. No. 6,091,640)

SUMMARY OF THE INVENTION

However, the present inventors have found that a design technology for a data storage apparatus as mentioned above has the following problems.

That is, since the respective controllers in the high-reliability version, the standard version, and the low-price version have different configurations, different types of semiconductor chips should be produced correspondingly for the individual controllers. Likewise, different types of printed circuit boards are needed for the mounting of the different types of controllers.

This causes the problem that not only design cost is increased but also production management is complicated and production cost is increased.

It is therefore an object of the present invention to provide a semiconductor data storage apparatus which allows a significant reduction in production cost therefor by using the same controller to support an external analog module and an internal analog module.

The above and other objects and novel features of the present invention will become apparent from the description of the present specification and the accompanying drawings.

A brief description will be given to the outline of the representative aspects of the present invention disclosed in the present application.

The present invention is a semiconductor data storage apparatus comprising: one or more semiconductor memories; a data processing unit for reading data stored in the one or more semiconductor memories based on an operating program and giving an instruction to perform a specified process, a data write operation, or the like; and an external analog module connected externally to the data processing unit, wherein the data processing unit has an internal analog module and a switching element for making enable/disable settings for the internal analog module and the external analog module.

A brief description will also be given to the outline of the other inventive aspects of the present application.

The present invention is a semiconductor data storage apparatus comprising: one or more semiconductor memories; a data processing unit for reading data stored in the one or more semiconductor memories based on an operating program and giving an instruction to perform a specified process, a data write operation, or the like; and an external analog module connected externally to the data processing unit, wherein the data processing unit has an internal analog module and a switching element for making enable/disable settings for the internal analog module and the external analog module and the switching element performs enable/disable switching control depending on an operating mode of each of the semiconductor memories.

The following is the brief description of effects achievable by the representative aspects of the invention disclosed in the present application.

(1) Since flexible switching can be performed between the external analog module and the internal analog module depending on the operating situation of the semiconductor data storage apparatus, the reliability of the semiconductor data storage apparatus can be enhanced significantly.

(2) Since the same data processing unit can be used to support the external analog module and the internal analog module, manufacturing cost for the semiconductor data storage apparatus and production management cost therefor can be reduced significantly.

DETAILED DESCRIPTION OF THE PREFERRED EMBODIMENTS

Figure 1:
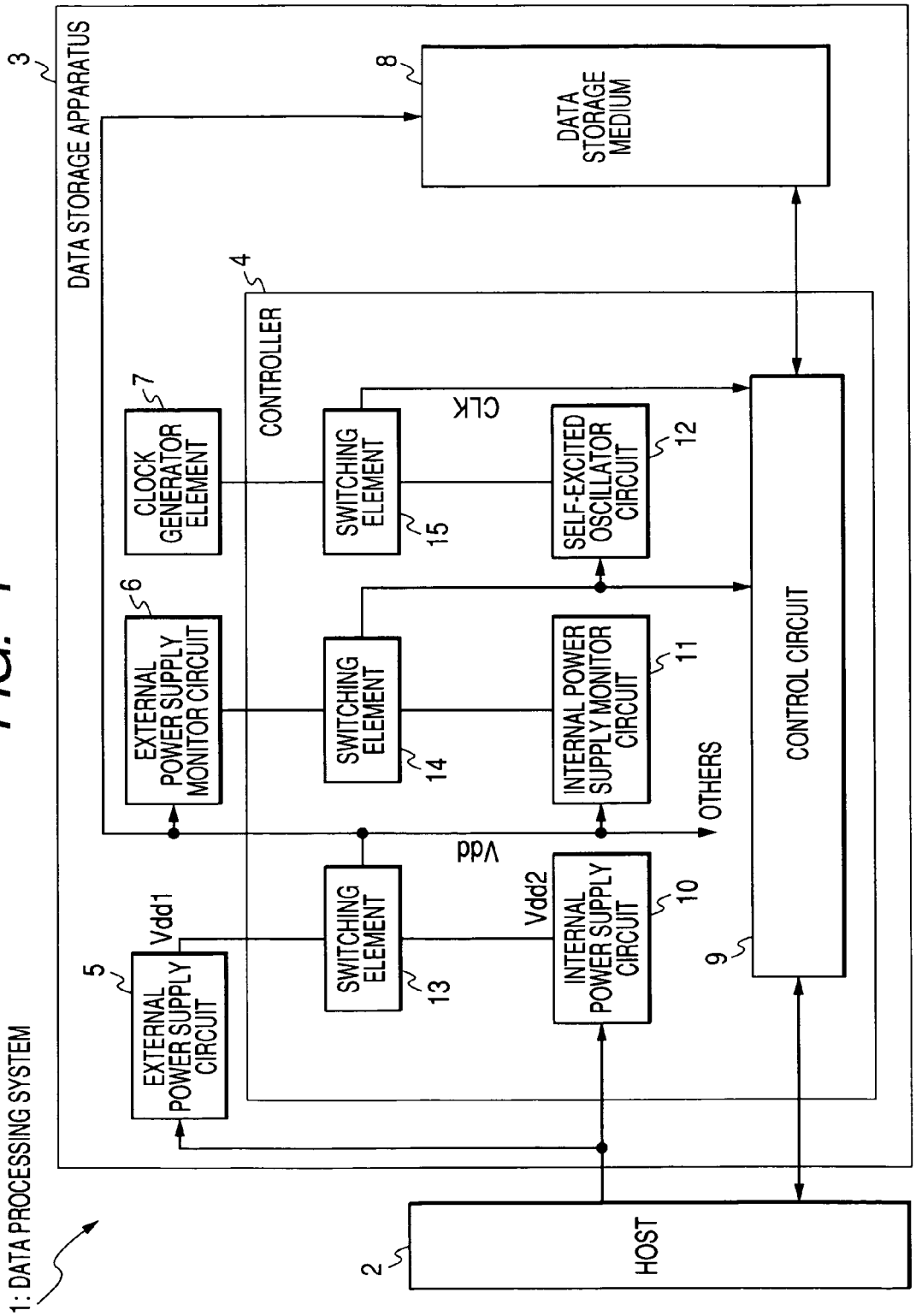
FIG. 1 is a block diagram of a data processing system according to an embodiment of the present invention.

Referring to the drawings, the embodiments of the present invention will be described herein below in detail. Throughout the drawings for illustrating the embodiments of the present invention, parts having the same functions are in principle designated by the same reference numerals and the repeated description thereof will be omitted.

Figure 2:
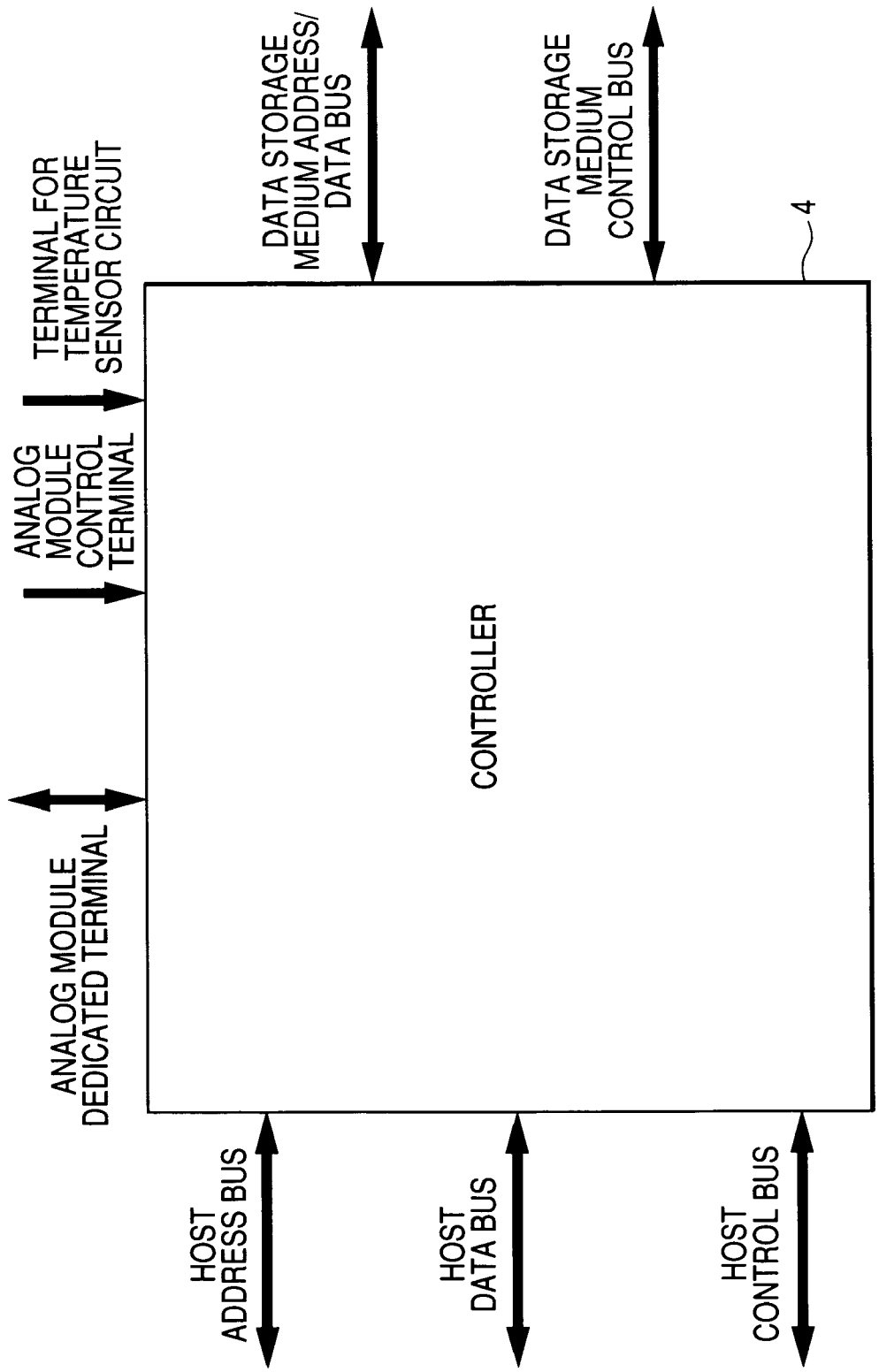
FIG. 2 is an illustrative view showing a schematic layout of external connection terminals in a controller provided in the data processing system of FIG. 1.
Figure 3:
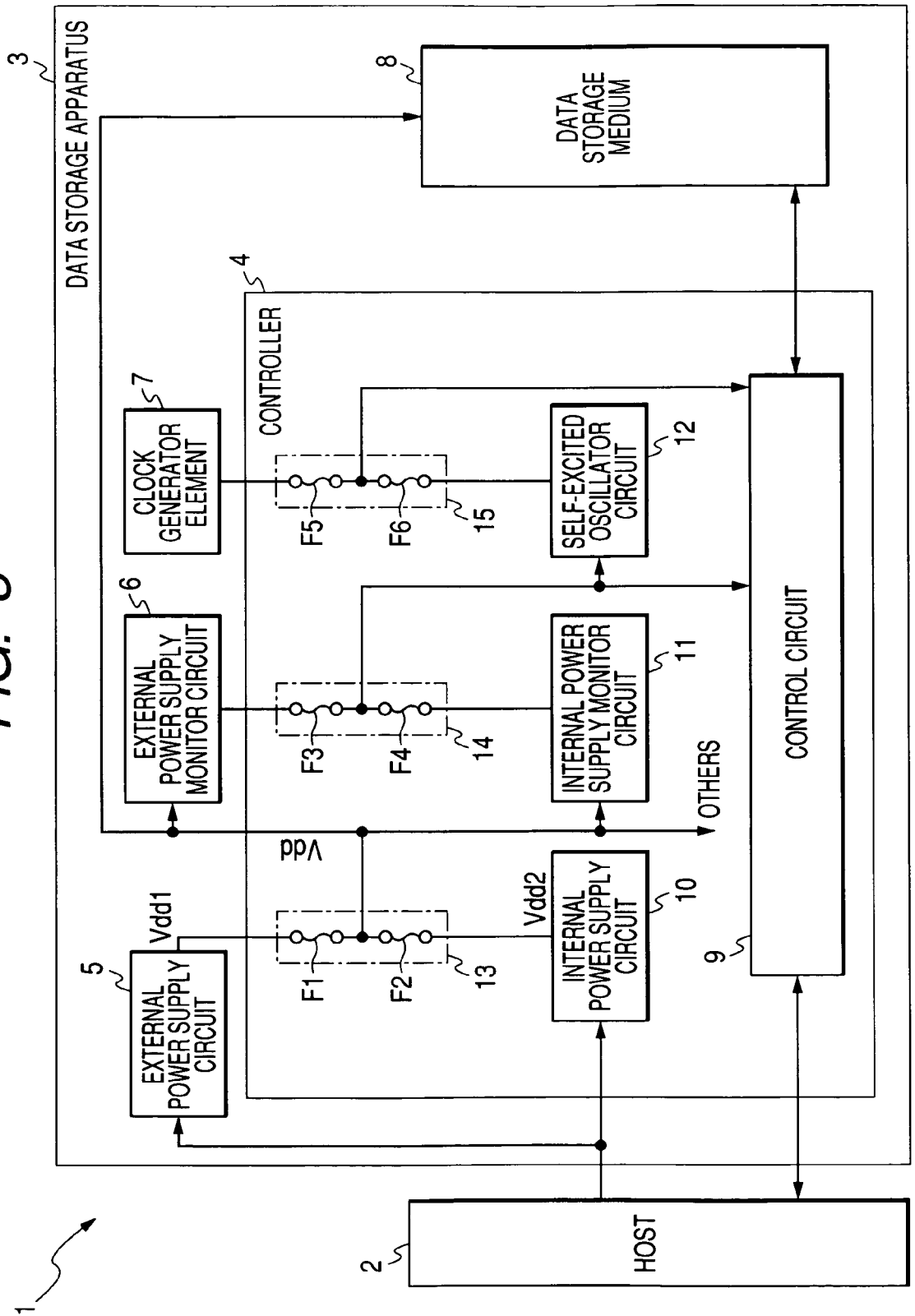
FIG. 3 is an illustrative view showing an example when fuses are used for the switching elements of the controller in the data processing system of FIG. 1.
Figure 4:
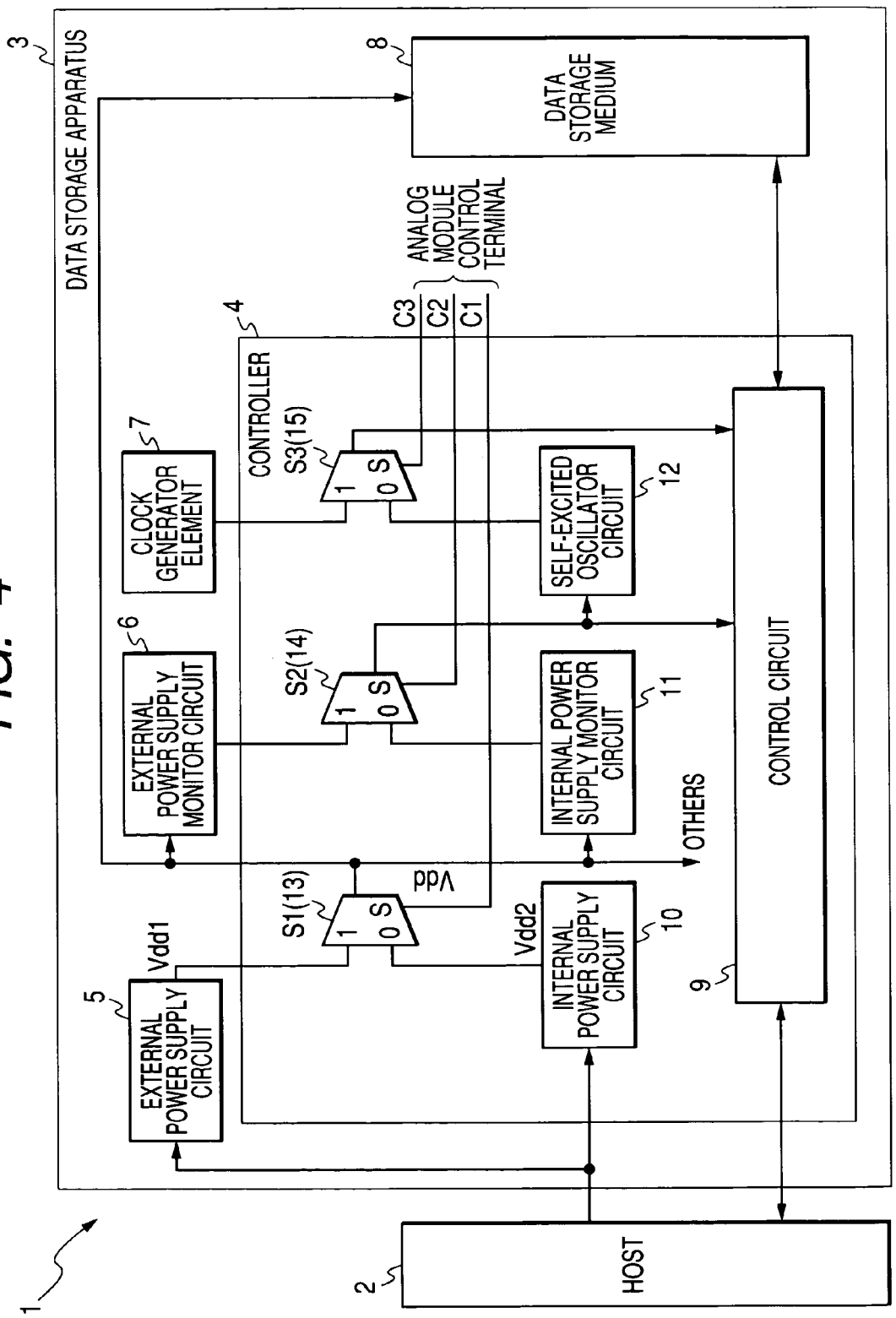
FIG. 4 is an illustrative view showing an example when the switching elements of the controller in the data processing system of FIG. 1 are composed of selectors.
Figure 5:
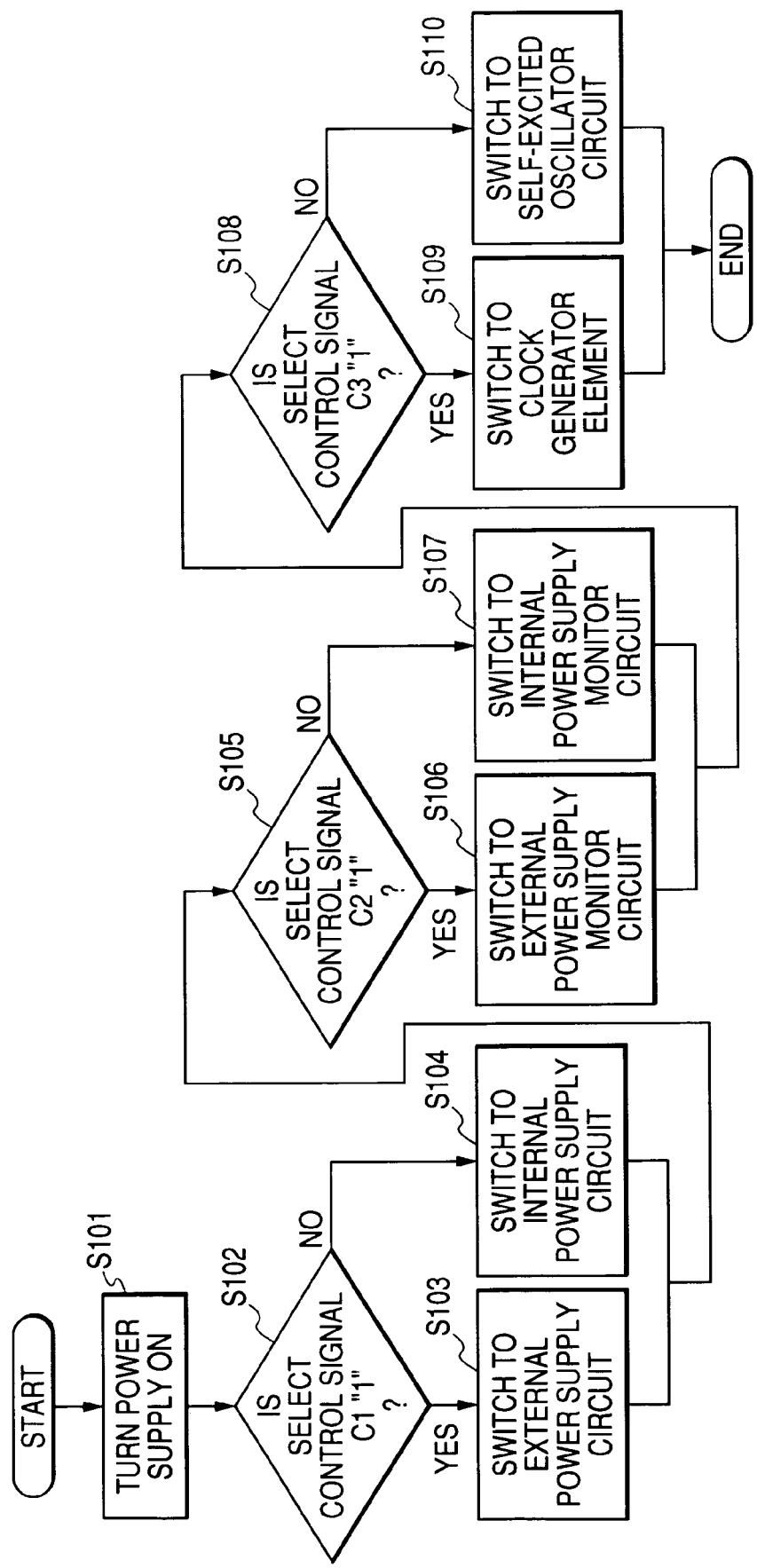
FIG. 5 is a flowchart showing an operation in the data processing system of FIG. 4.
Figure 6:
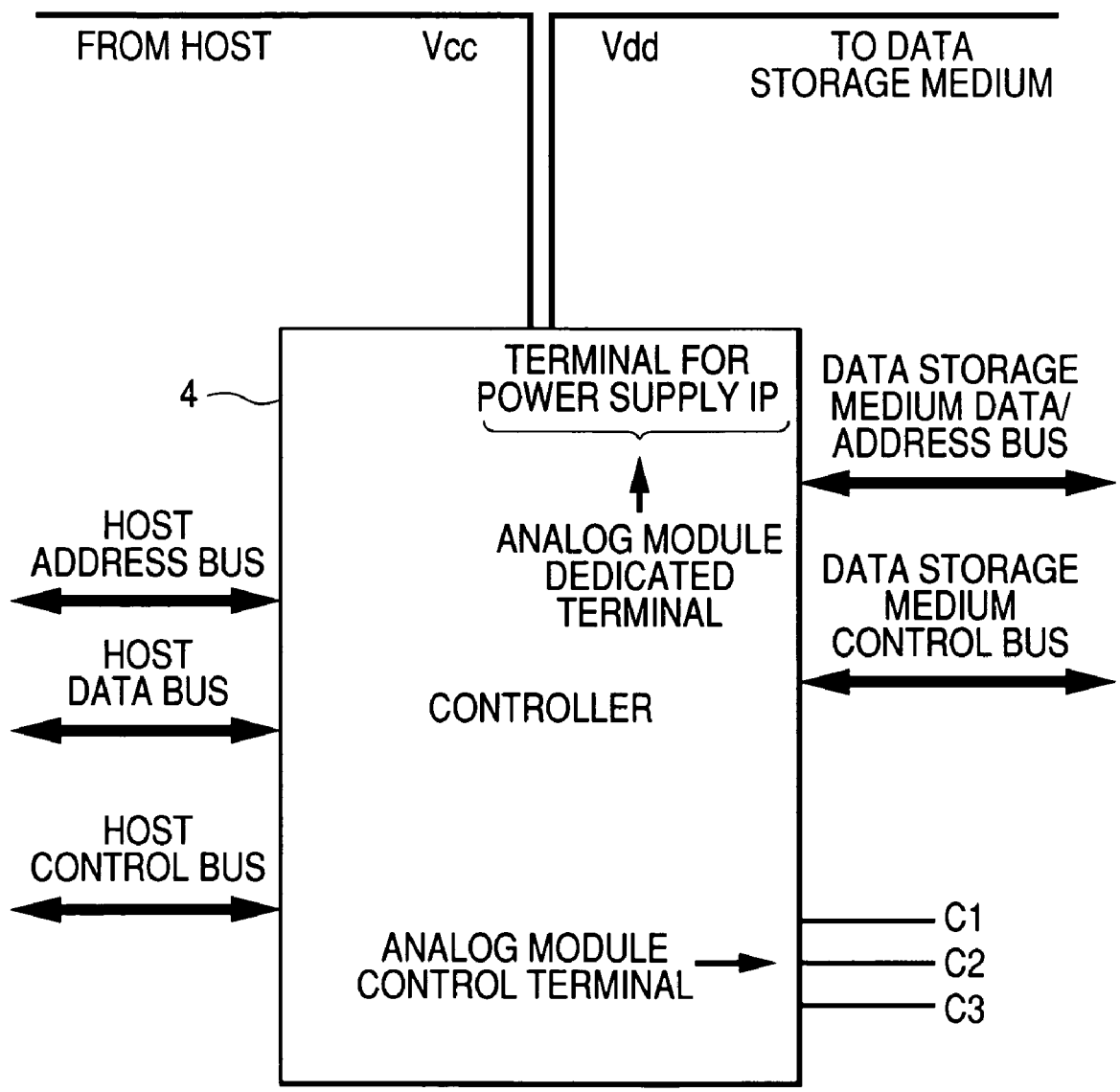
FIG. 6 is a view illustrating the controller when an internal analog module is selected as a result of the process of FIG. 5.
Figures 7, 8:
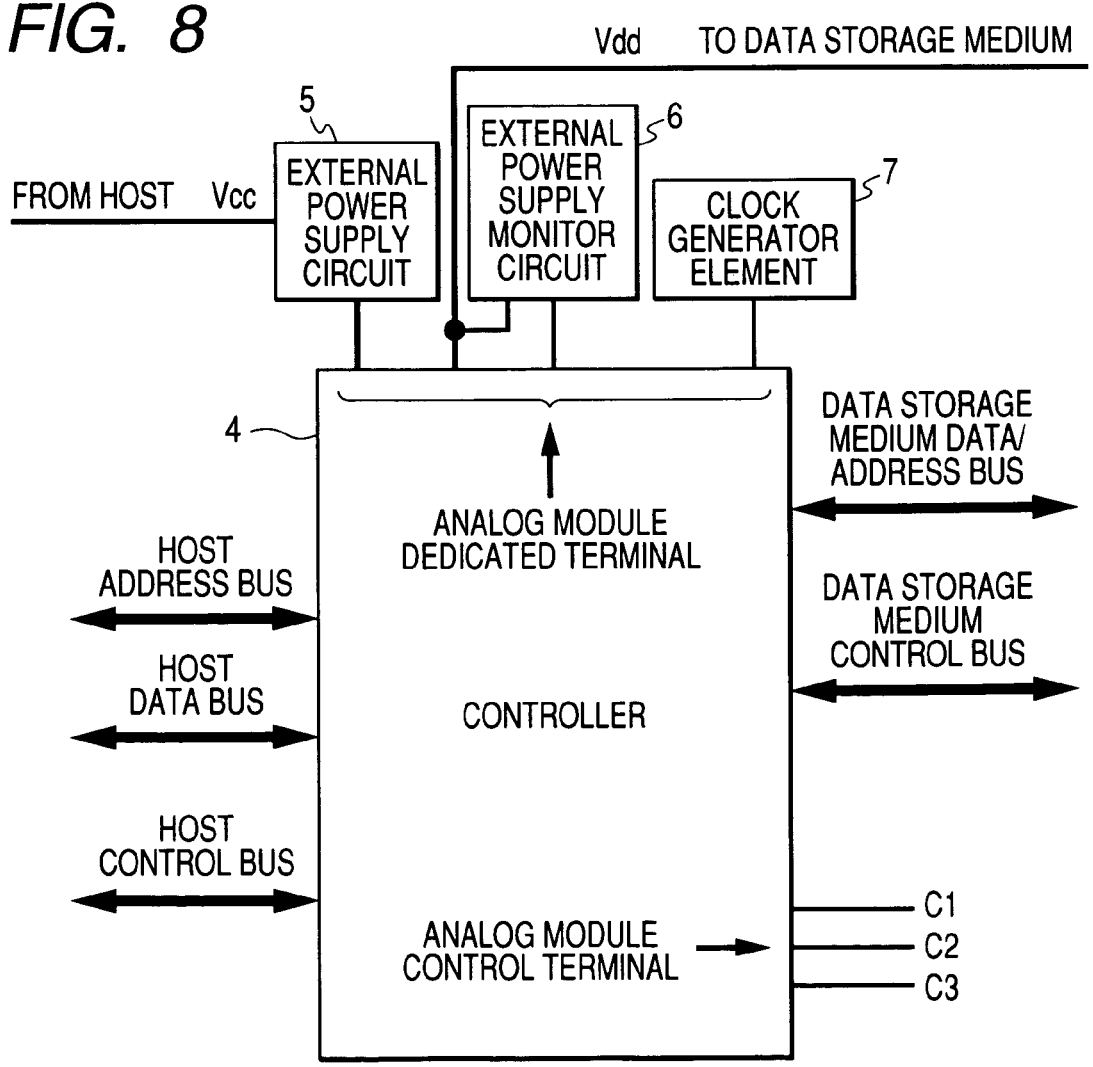
FIG. 7 is a view illustrating the processing of select control signals at analog module dedicated terminals in the controller of FIG. 2.
FIG. 8 is a view illustrating the controller when an external analog module is selected as a result of the process of FIG. 5.
Figure 9:
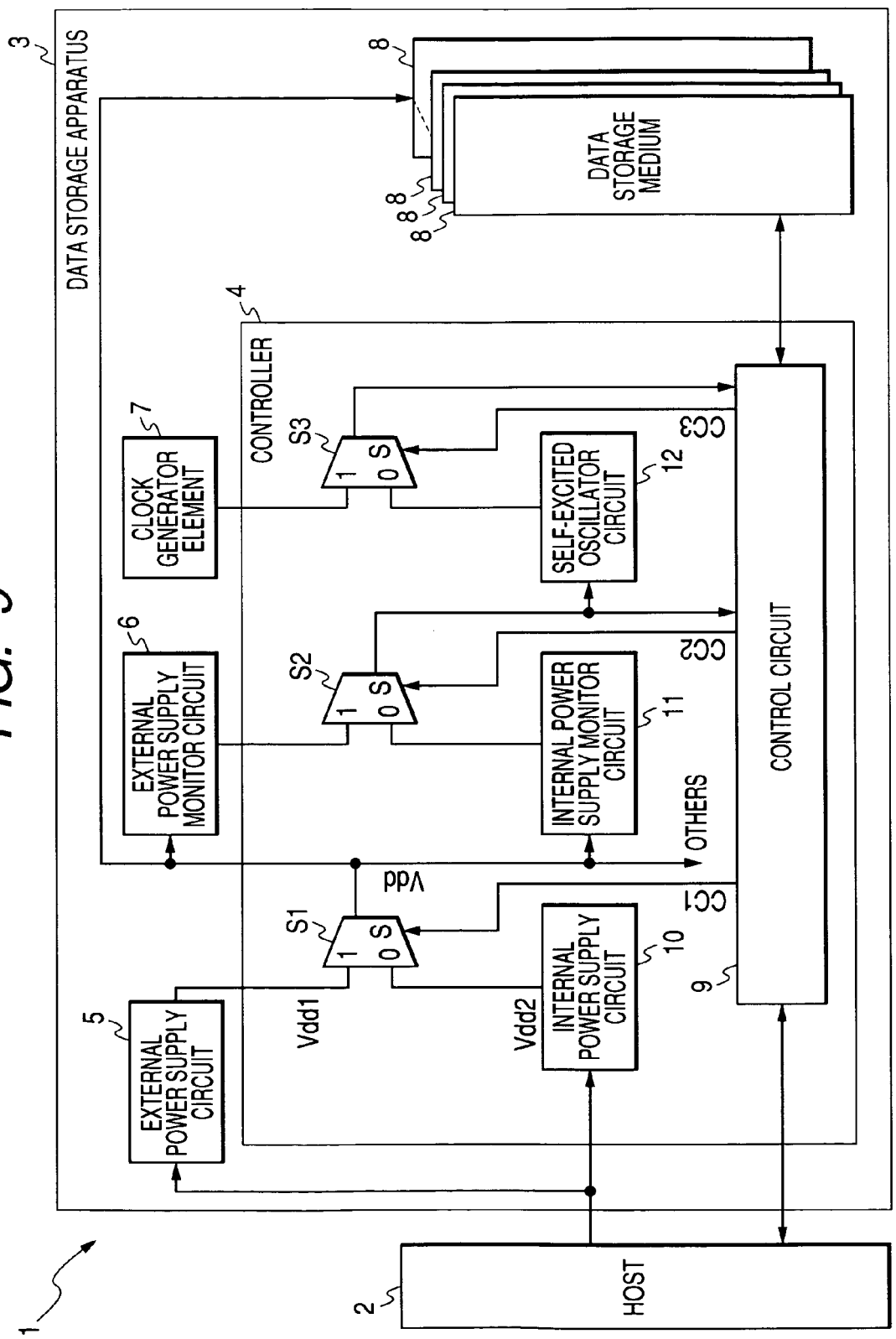
FIG. 9 is an illustrative view showing an example when switching is performed between the internal module and the external module based on the number of data storage media in connection in the data processing system of FIG. 1.
Figure 10:
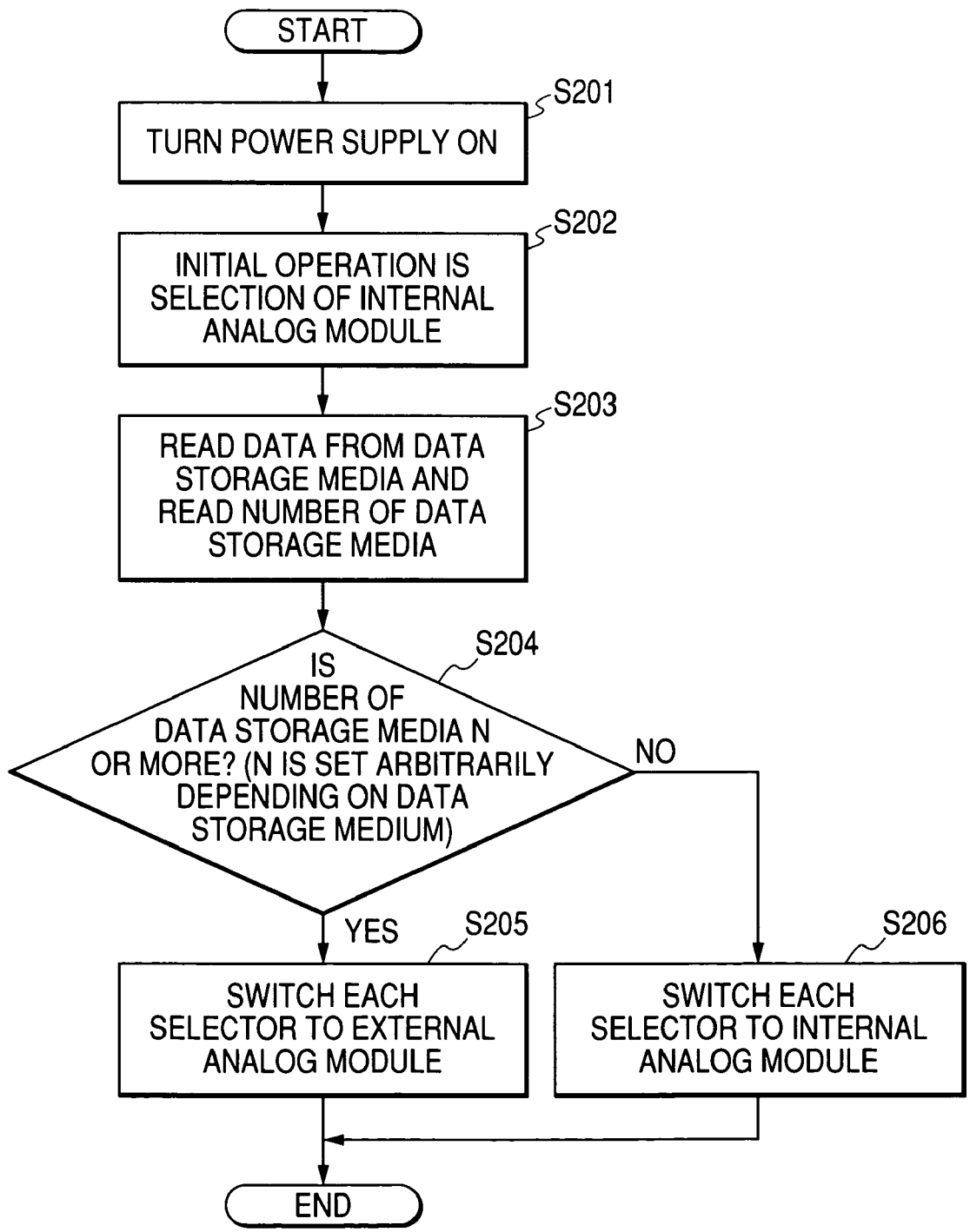
FIG. 10 is a flow chart showing an operation in the data processing system of FIG. 9.
Figure 11:
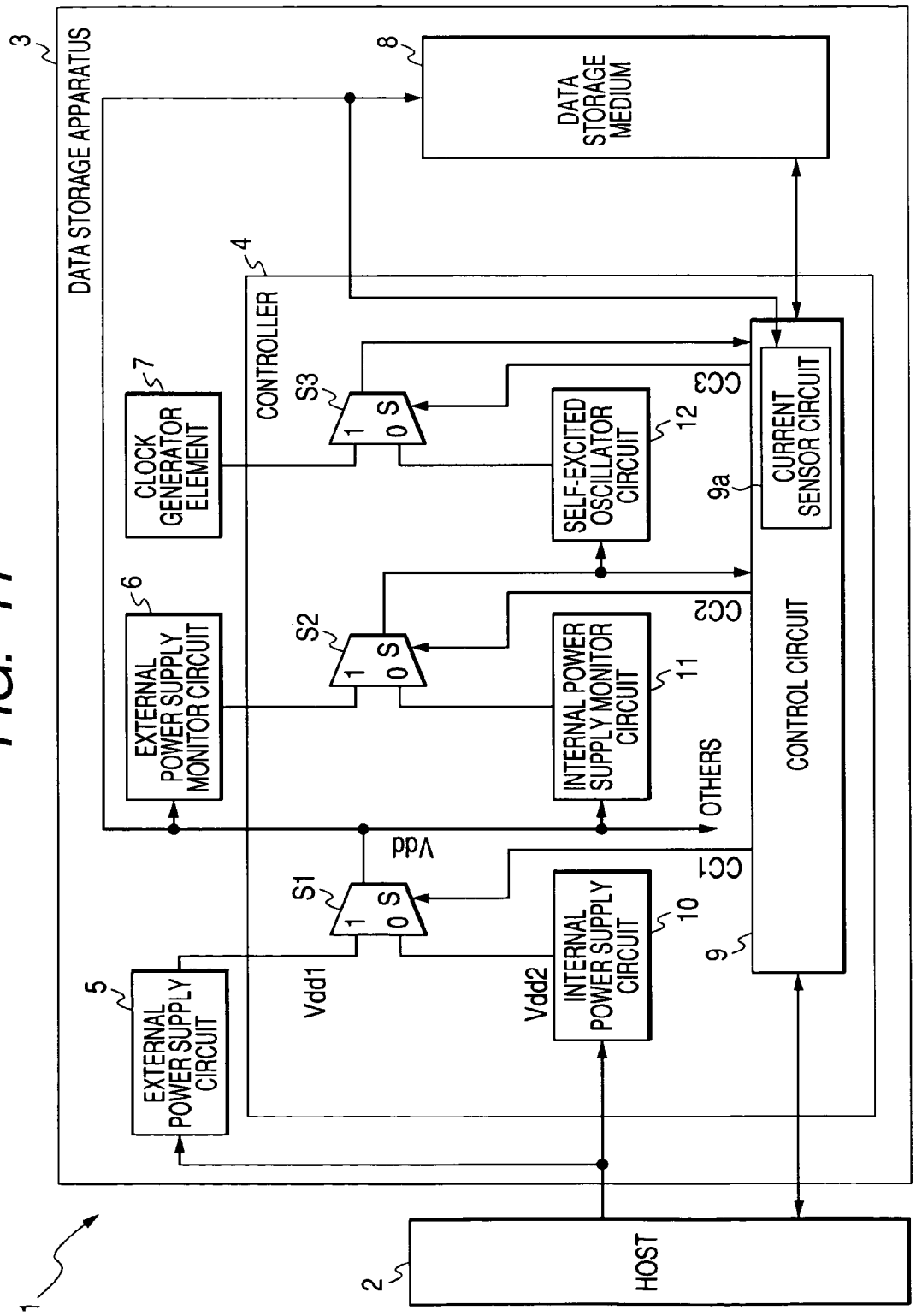
FIG. 11 is an illustrative view showing an exemplary case where the controller in the data processing system of FIG. 1 controls the switching of the selectors based on the current level of an internal power supply voltage.
Figure 12:
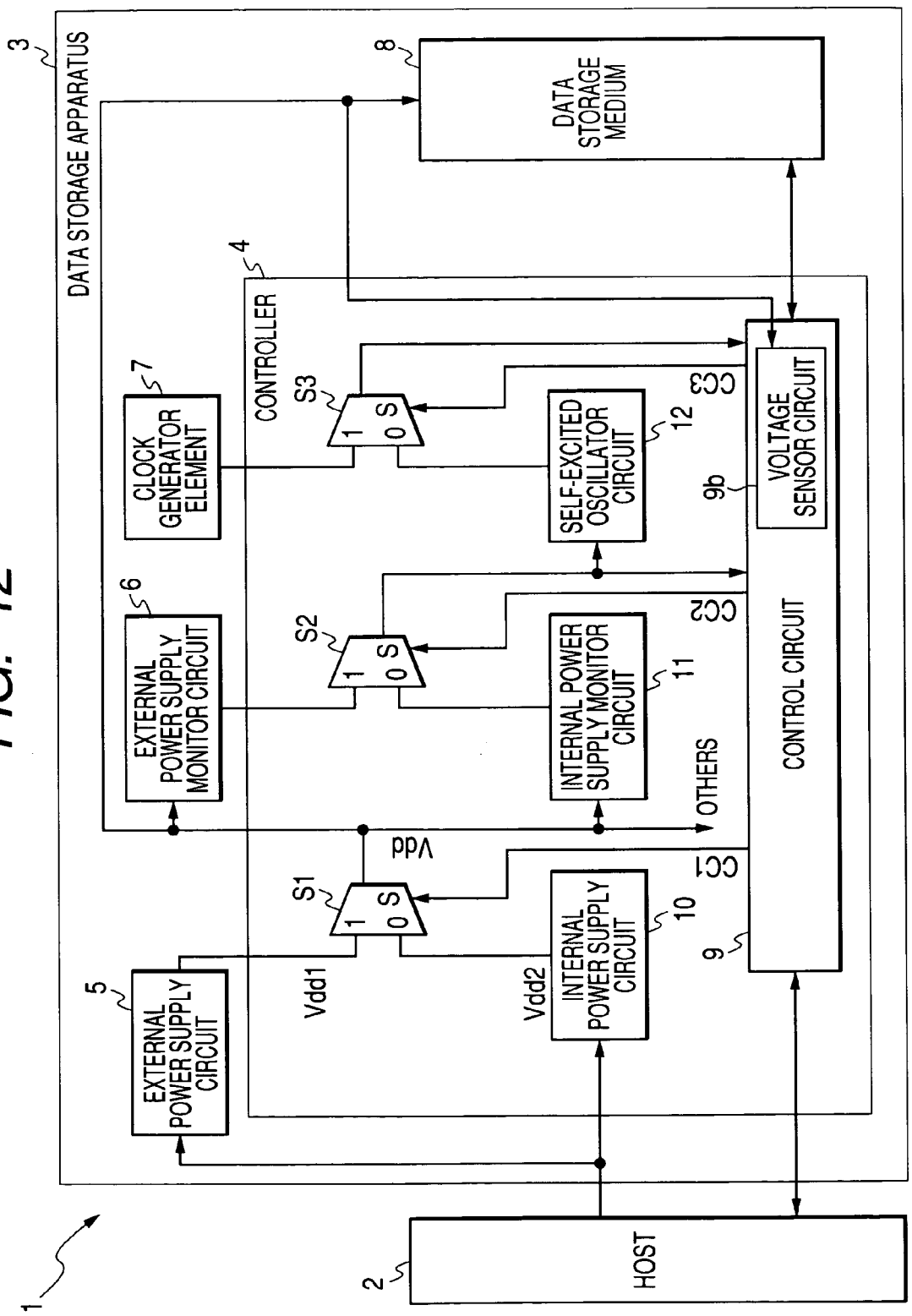
FIG. 12 is an illustrative view showing an exemplary case where the controller in the data processing system of FIG. 1 controls the switching of the selectors based on the voltage level of the internal power supply voltage.
Figure 13:
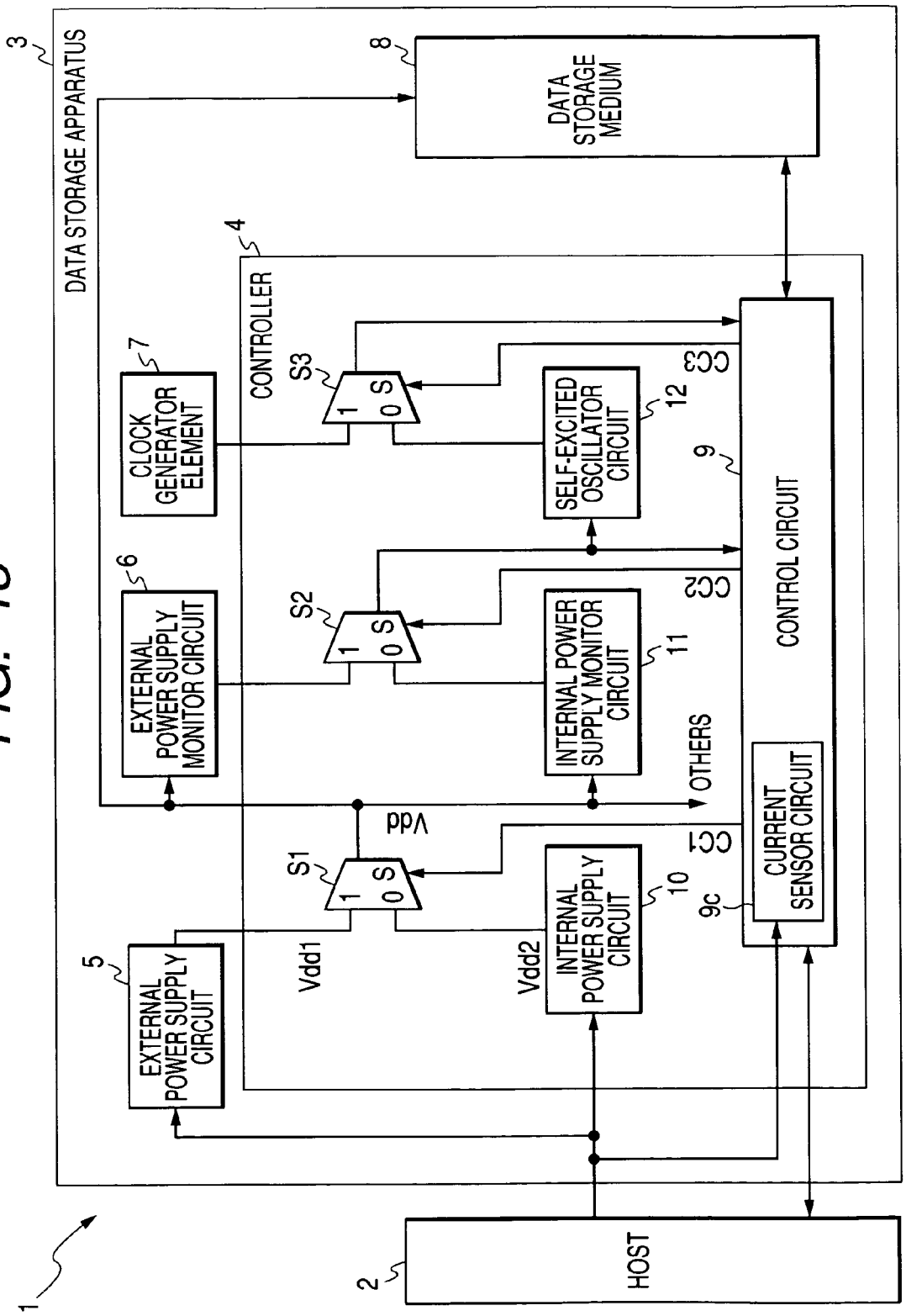
FIG. 13 is an illustrative view showing an exemplary case where the controller in the data processing system of FIG. 1 controls the switching of the selectors based on the current level of a power supply voltage.
Figure 14:
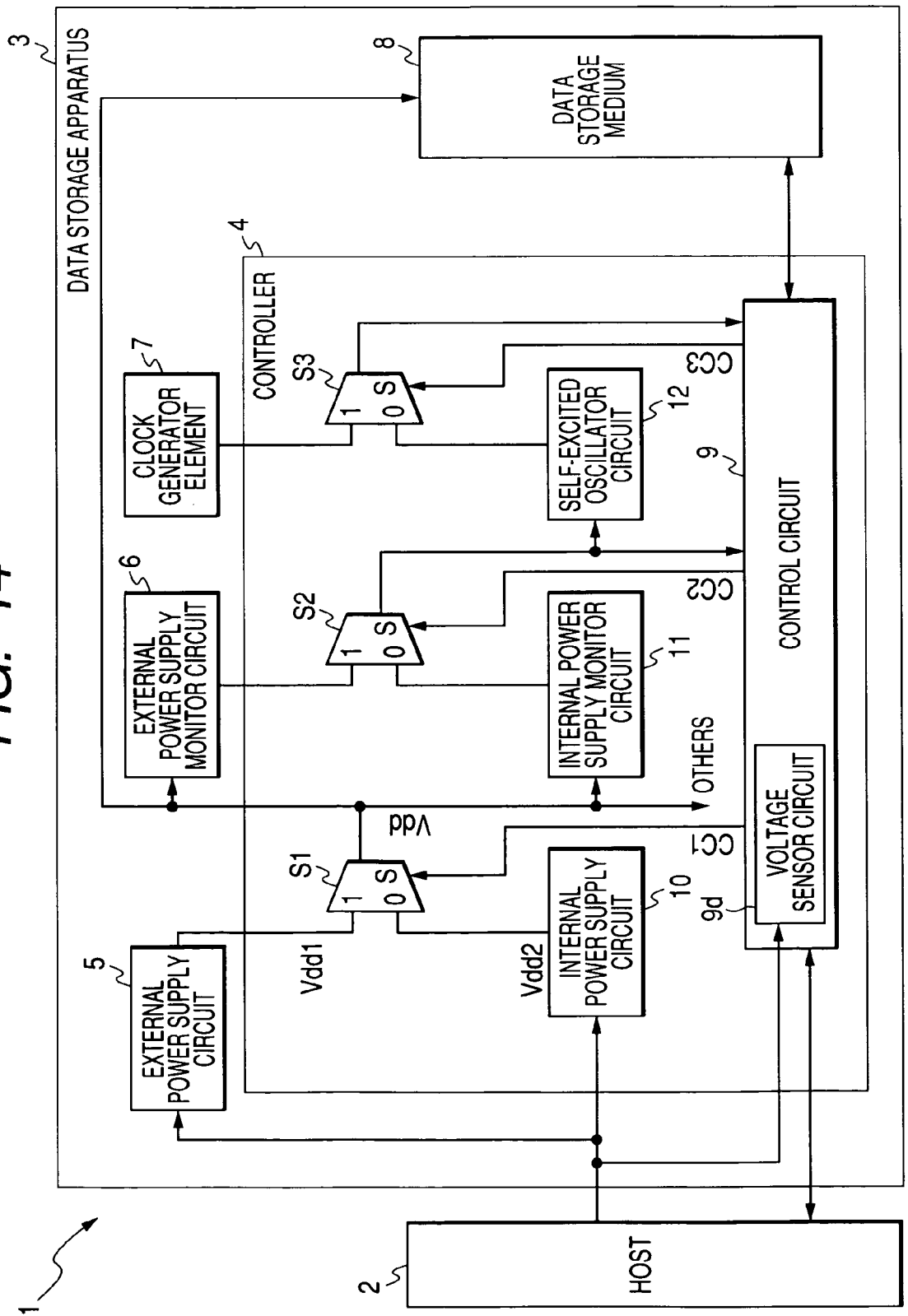
FIG. 14 is an illustrative view showing an exemplary case where the controller in the data processing system of FIG. 1 controls the switching of the selectors based on the voltage level of the power supply voltage.
Figure 15:
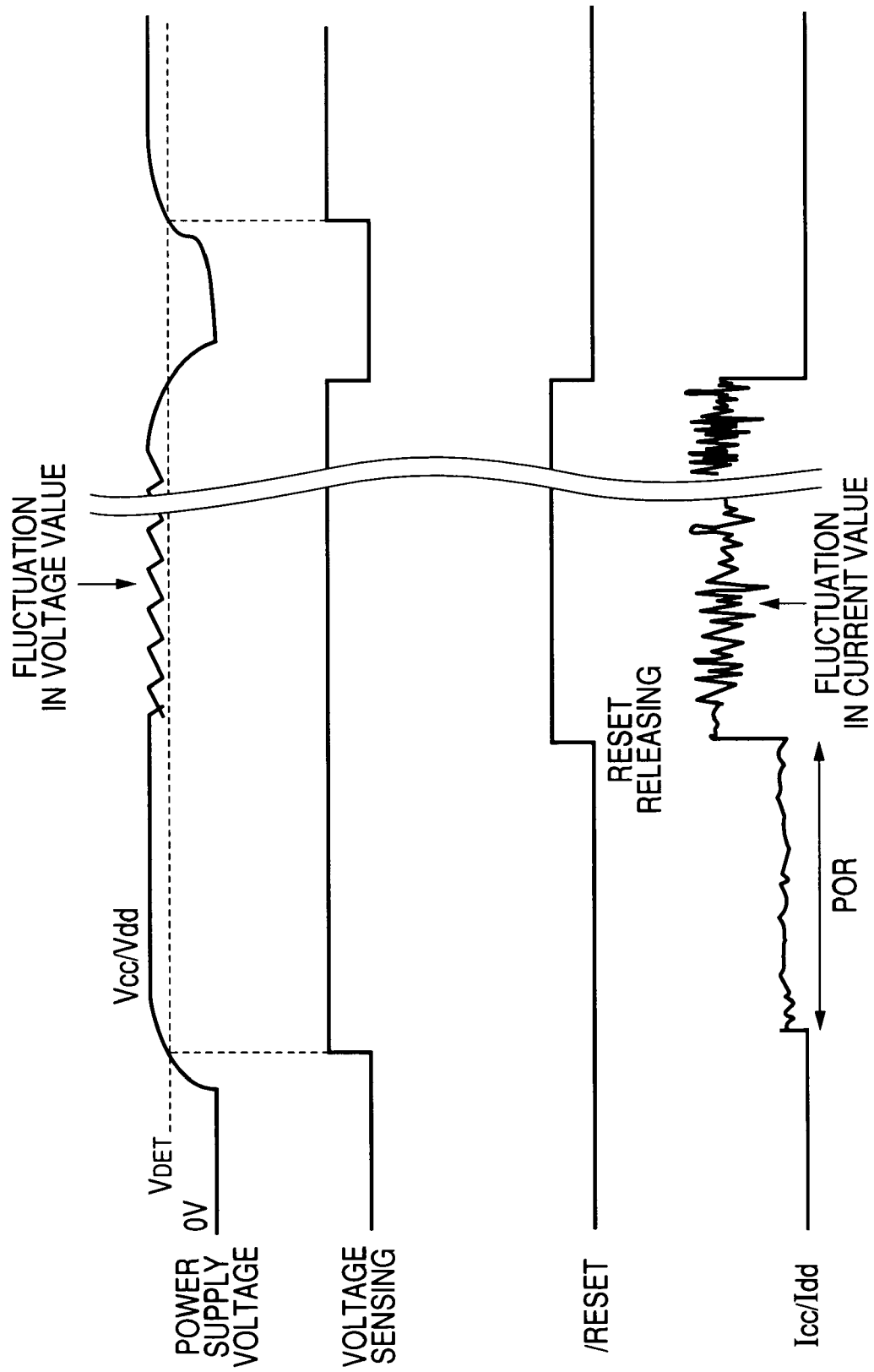
FIG. 15 is a timing chart showing an example of current-value/voltage-value fluctuations in the power supply voltage after the turning ON of a power supply and in the internal power supply voltage in the data processing system of FIG. 1.
Figure 16:
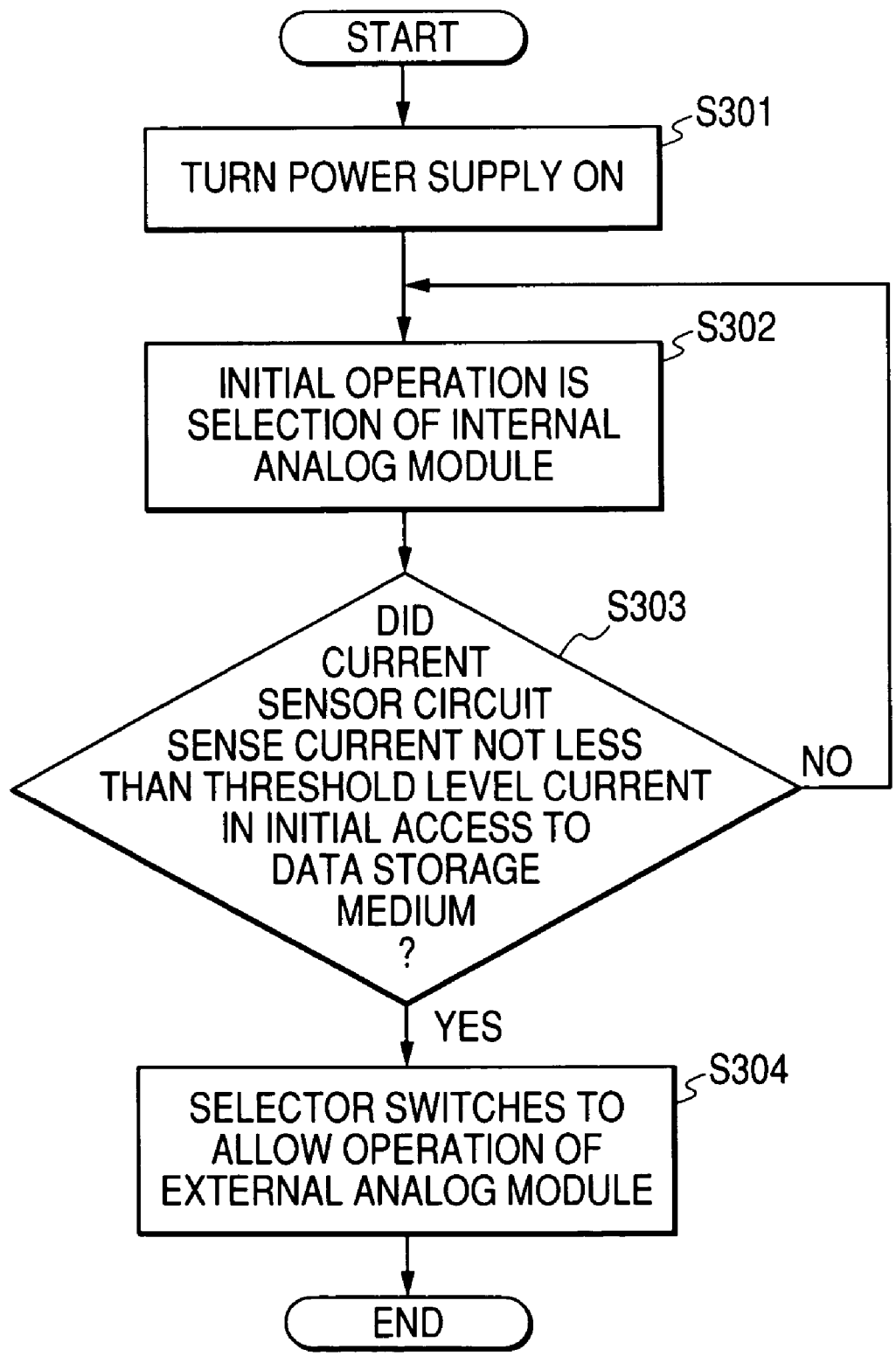
FIG. 16 is a flow chart showing a process in the controller in the data processing system of FIG. 11.
Figure 17:
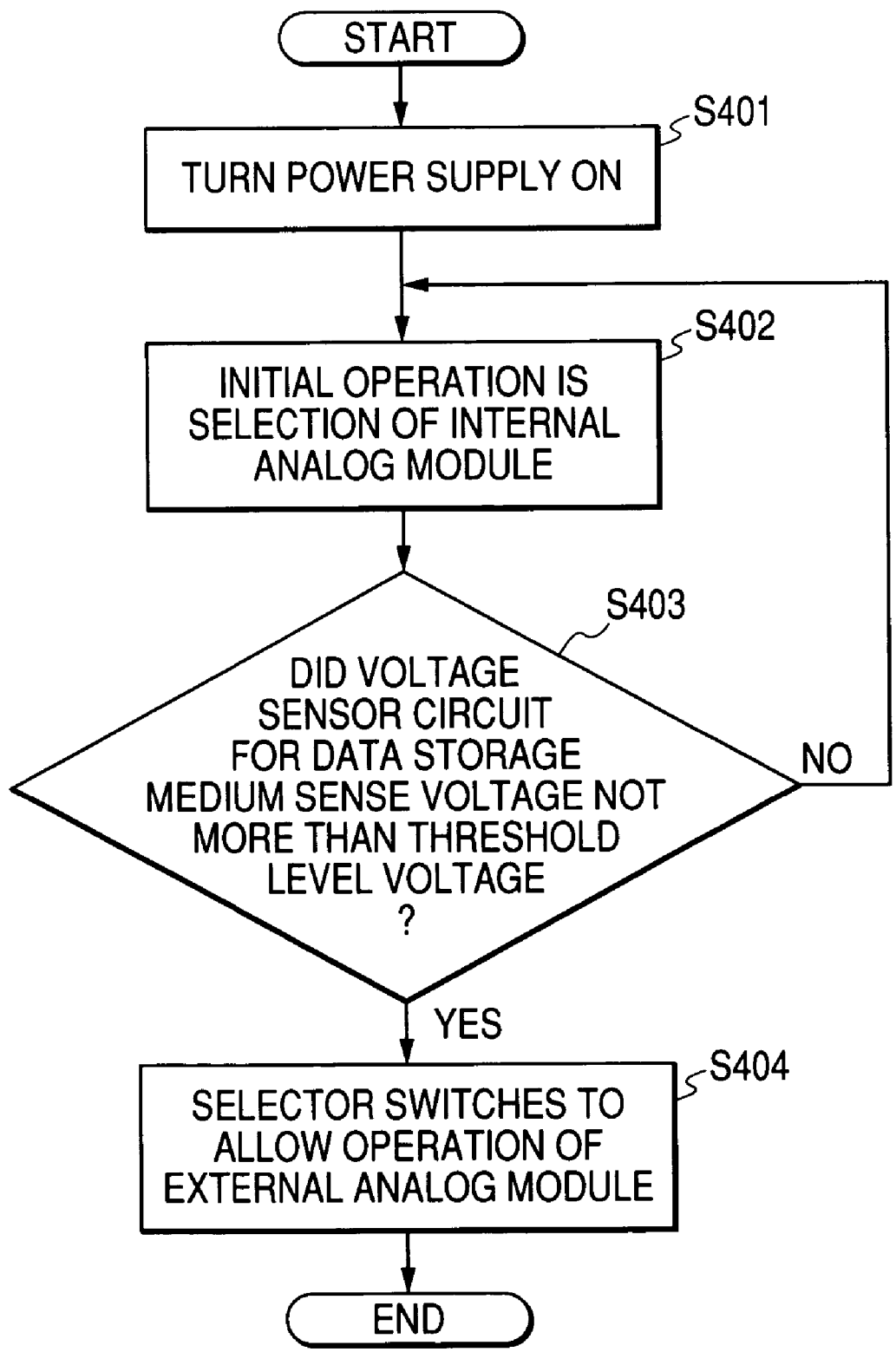
FIG. 17 is a flow chart showing a process in the controller in the data processing system of FIG. 12.
Figure 18:
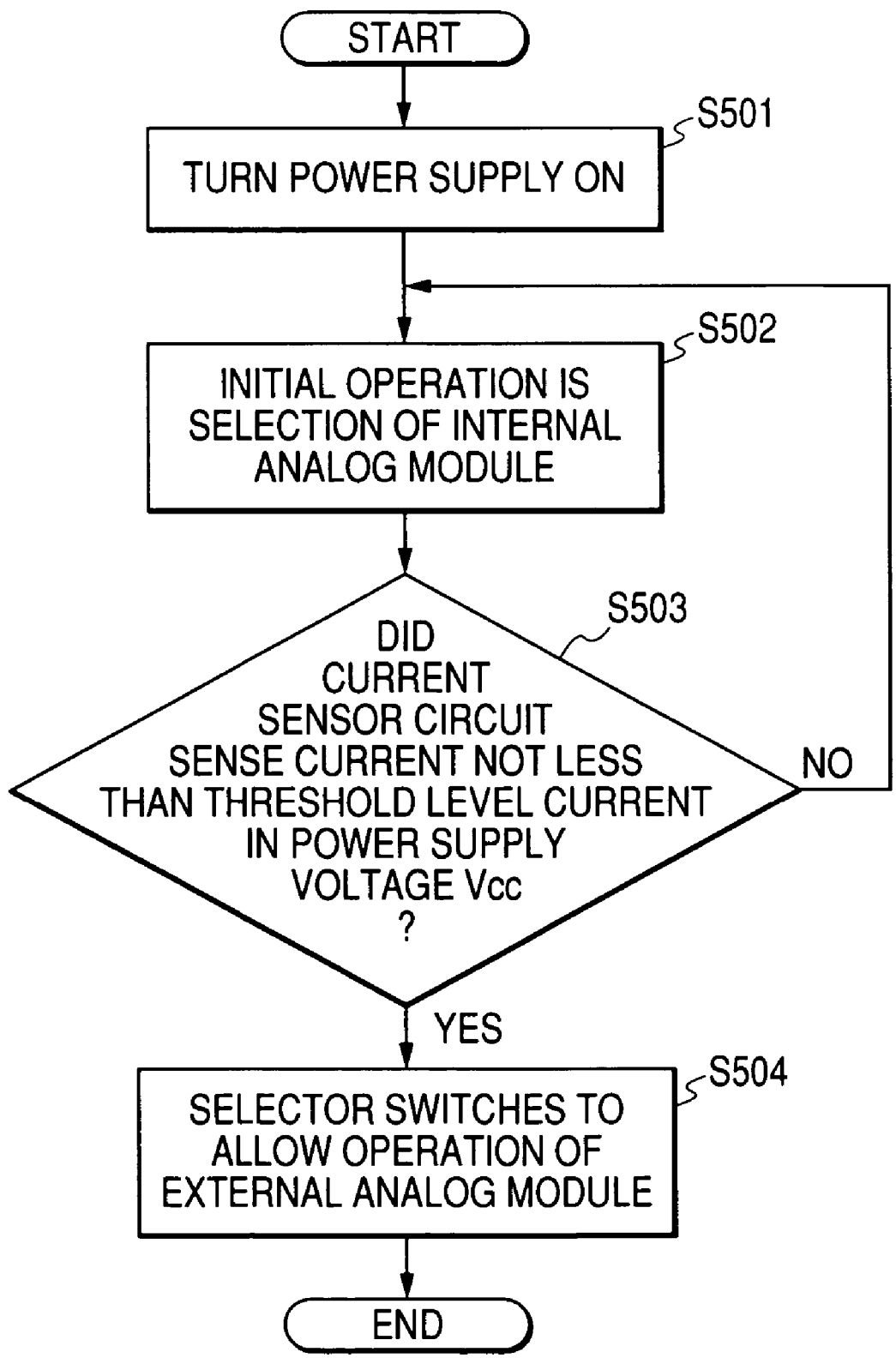
FIG. 18 is a flow chart showing a process in the controller in the data processing system of FIG. 13.
Figure 19:
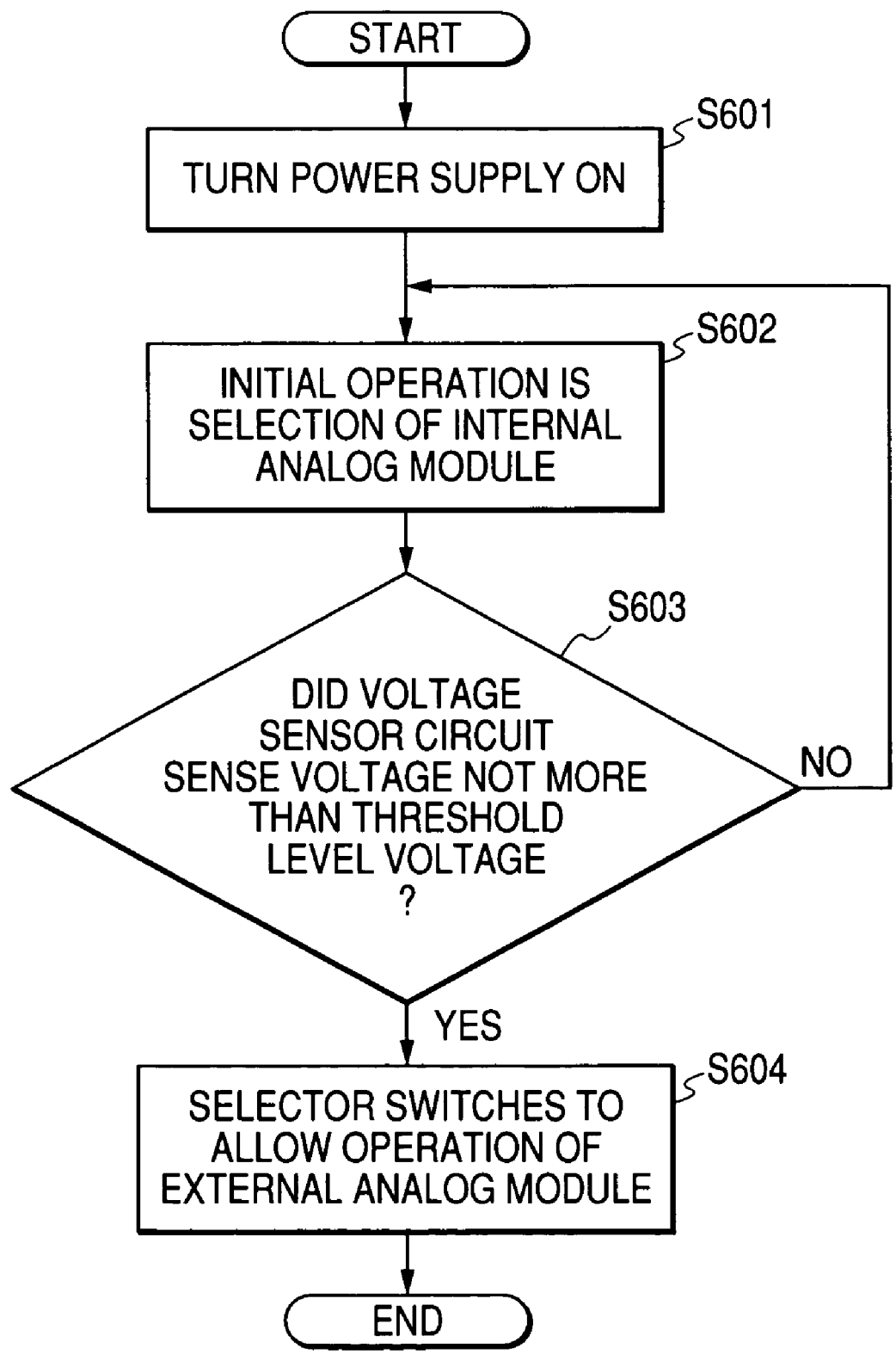
FIG. 19 is a flow chart showing a process in the controller in the data processing system of FIG. 14.
Figure 20:
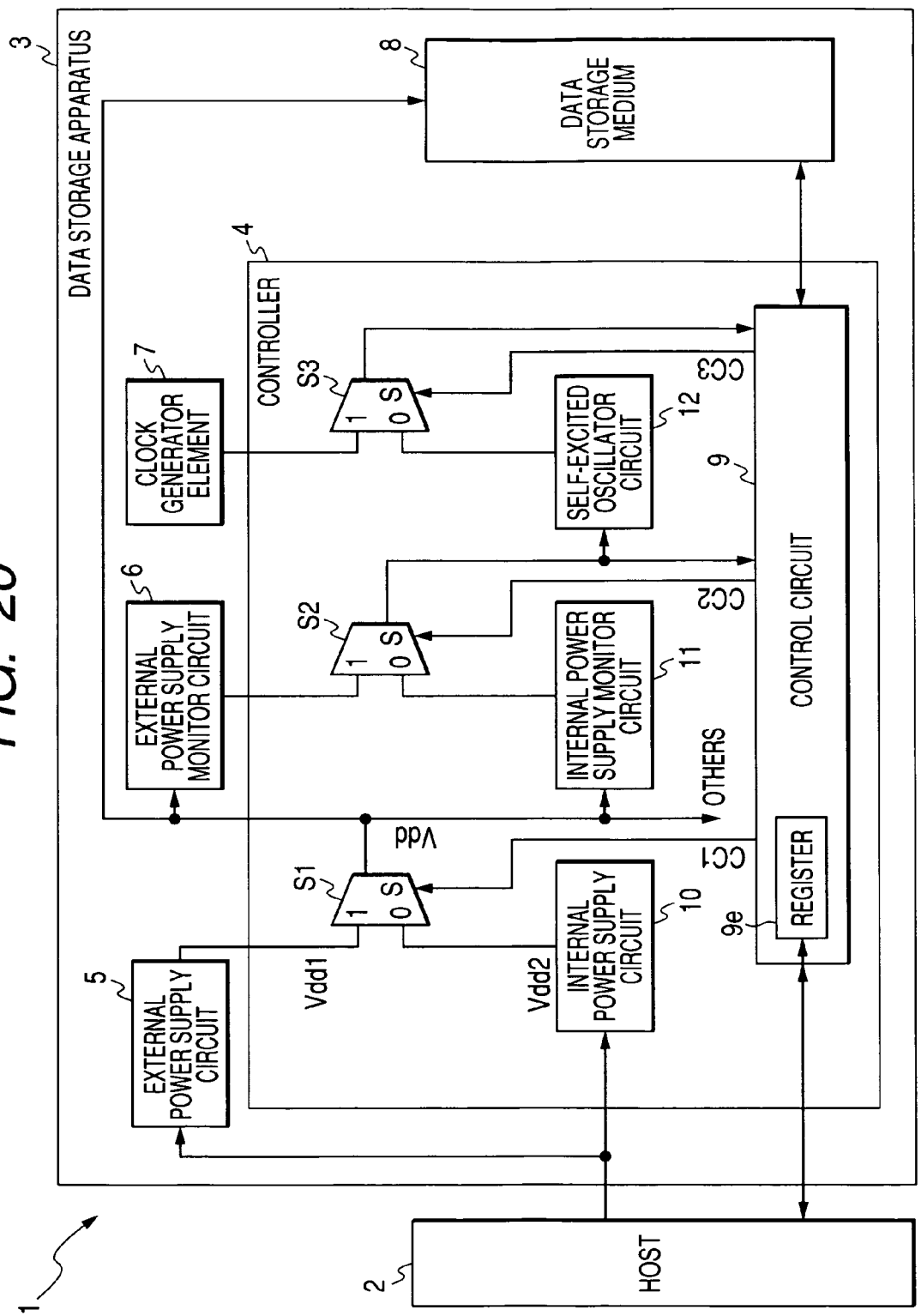
FIG. 20 is an illustrative view showing an example when the controller in the data processing system of FIG. 1 controls the switching of the selectors based on a command from a host.
Figure 21:
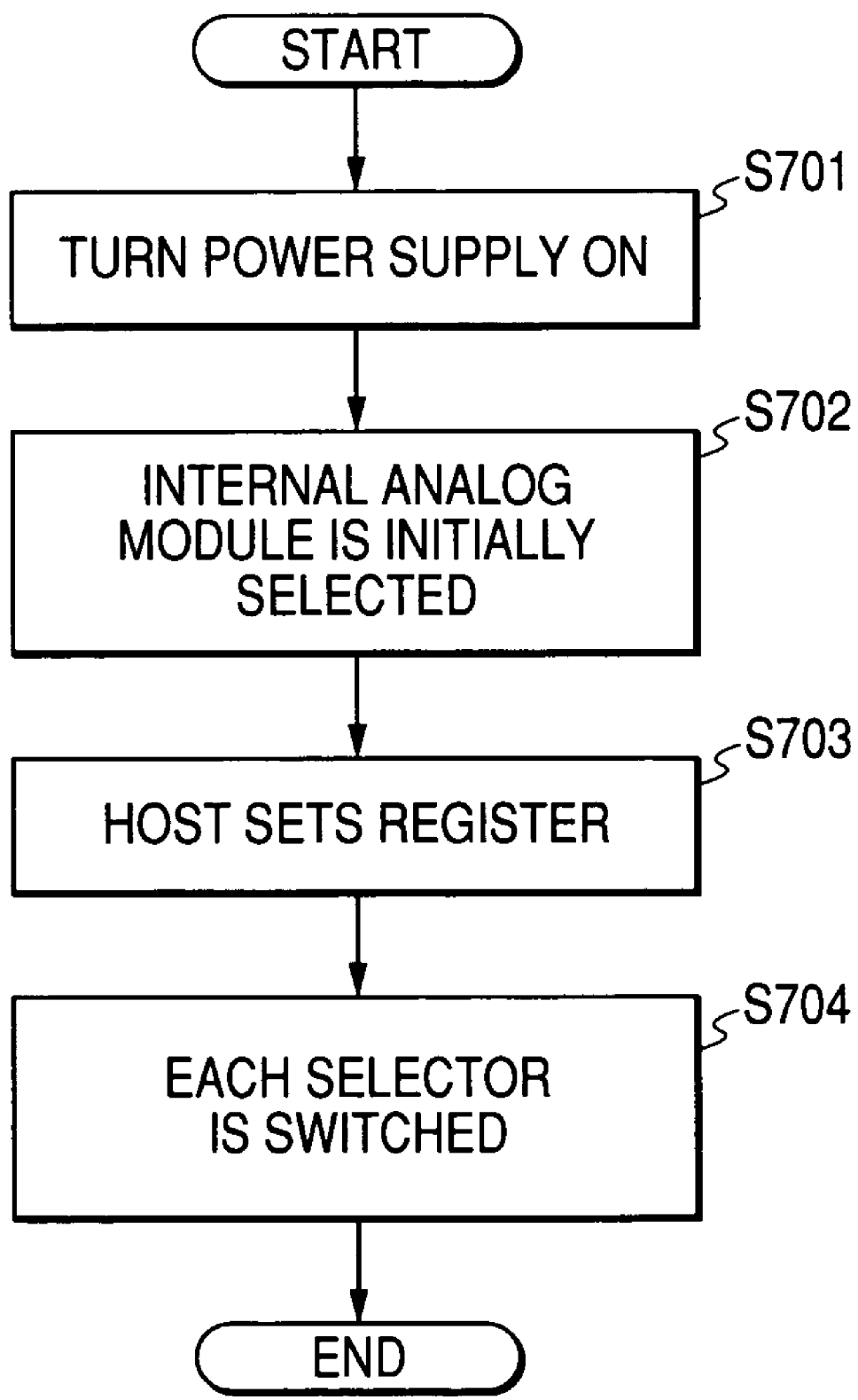
FIG. 21 is a flow chart showing a process in the data processing system of FIG. 20.
Figure 22:
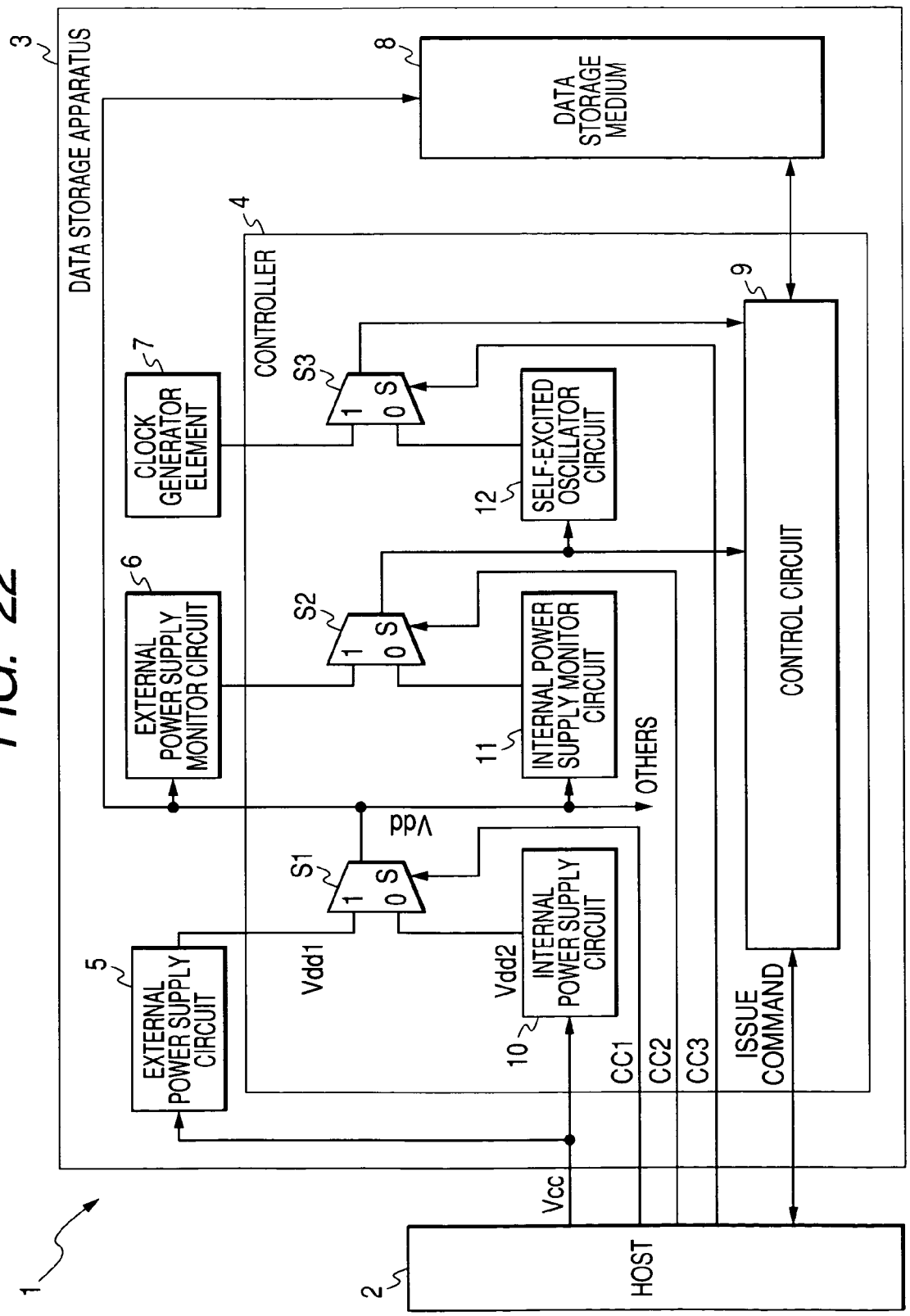
FIG. 22 is an illustrative view when the host in the data processing system of FIG. 1 directly controls the switching of the selectors in the data processing system of FIG. 1.
Figure 23:
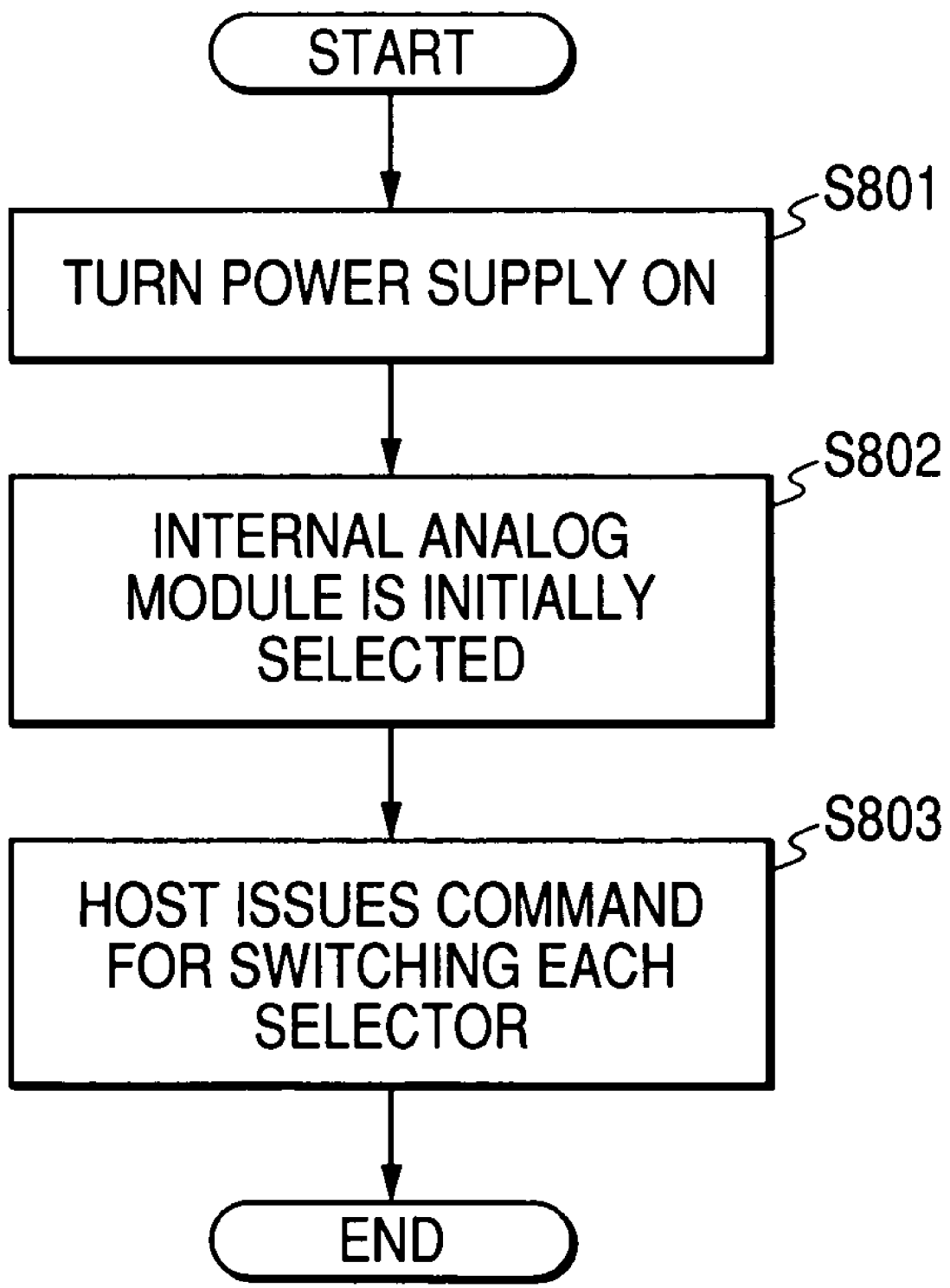
FIG. 23 is a flow chart showing a process in the data processing system of FIG. 22.
Figure 24:
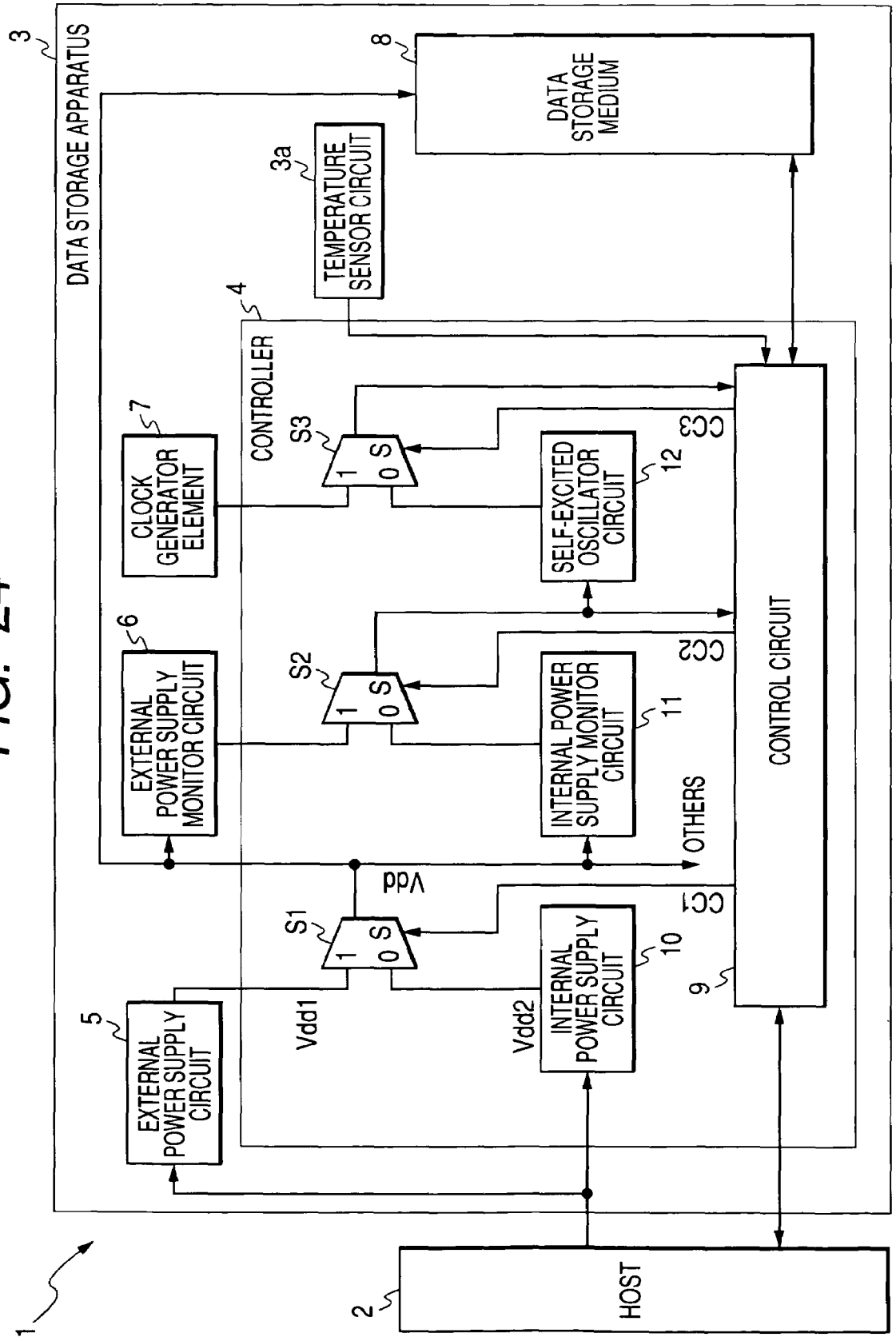
FIG. 24 is an illustrative when the data processing system of FIG. 1 controls the switching of the selectors by sensing a temperature.
Figure 25:
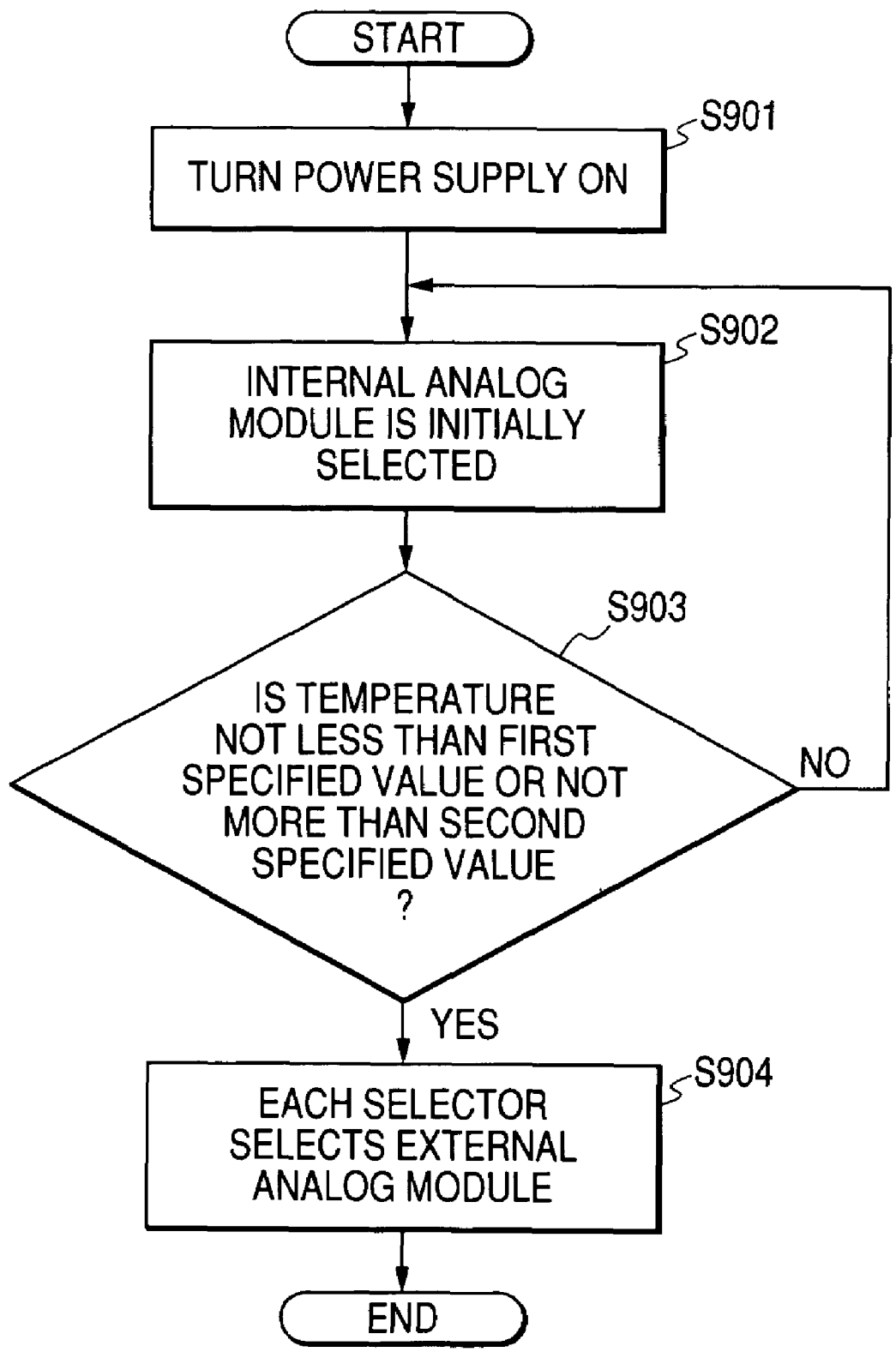
FIG. 25 is a flow chart showing a process in the data processing system of FIG. 24.

FIG. 1 is a block diagram of a data processing system according to an embodiment of the present invention. FIG. 2 is an illustrative view showing a schematic layout of external connection terminals in a controller provided in the data processing system of FIG. 1. FIG. 3 is an illustrative view showing an example when fuses are used for the switching elements of the controller in the data processing system of FIG. 1. FIG. 4 is an illustrative view showing an example when the switching elements of the controller in the data processing system of FIG. 1 are composed of selectors. FIG. 5 is a flow chart showing an operation in the data processing system of FIG. 4. FIG. 6 is a view illustrating the controller when an internal analog module is selected as a result of the process of FIG. 5. FIG. 7 is a view illustrating the processing of select control signals at analog module dedicated terminals in the controller of FIG. 2. FIG. 8 is a view illustrating the controller when an external analog module is selected as a result of the process of FIG. 5. FIG. 9 is an illustrative view showing an example when switching is performed between the internal module and the external module based on the number of data storage media in connection in the data processing system of FIG. 1. FIG. 10 is a flow chart showing an operation in the data processing system of FIG. 9. FIG. 11 is an illustrative view showing an exemplary case where the controller in the data processing system of FIG. 1 controls the switching of the selectors based on the current level of an internal power supply voltage. FIG. 12 is an illustrative view showing an exemplary case where the controller in the data processing system of FIG. 1 controls the switching of the selectors based on the voltage level of the internal power supply voltage. FIG. 13 is an illustrative view showing an exemplary case where the controller in the data processing system of FIG. 1 controls the switching of the selectors based on the current level of a power supply voltage. FIG. 14 is an illustrative view showing an exemplary case where the controller in the data processing system of FIG. 1 controls the switching of the selectors based on the voltage level of the power supply voltage. FIG. 15 is a timing chart showing an example of current-value/voltage-value fluctuations in the power supply voltage after the turning ON of a power supply and in the internal power supply voltage in the data processing system of FIG. 1. FIG. 16 is a flow chart showing a process in the controller in the data processing system of FIG. 11. FIG. 17 is a flow chart showing a process in the controller in the data processing system of FIG. 12. FIG. 18 is a flow chart showing a process in the controller in the data processing system of FIG. 13. FIG. 19 is a flow chart showing a process in the controller in the data processing system of FIG. 14. FIG. 20 is an illustrative view showing an example when the controller in the data processing system of FIG. 1 controls the switching of the selectors based on a command from a host. FIG. 21 is a flow chart showing a process in the data processing system of FIG. 20. FIG. 22 is an illustrative view when the host in the data processing system of FIG. 1 directly controls the switching of the selectors in the data processing system of FIG. 1. FIG. 23 is a flow chart showing a process in the data processing system of FIG. 22. FIG. 24 is an illustrative when the data processing system of FIG. 1 controls the switching of the selectors by sensing a temperature. FIG. 25 is a flow chart showing a process in the data processing system of FIG. 24.

In the present embodiment, a data processing system 1 is composed of a host (data processing apparatus) 2 and a semiconductor data storage apparatus 3. The host 2 is composed of a data processing apparatus such as a personal computer or a multi-function terminal.

The semiconductor data storage apparatus 3 is composed of a memory card used as an external storage media for the host 2. The semiconductor data storage apparatus 3 is composed of a controller (data processing unit) 4, an external power supply circuit (external analog module) 5, an external power supply monitor circuit (external analog module) 6, a clock generator element (external analog module, external clock oscillator circuit) 7, and a data storage medium (semiconductor memory) 8.

The data storage medium 8 is composed of a semiconductor memory such as, e.g., a flash memory (FLASH EEPROM). Although a structure provided with one data storage medium 8 is shown herein, a plurality of the data storage media 8 may also be provided.

The data storage medium 8 may also be a memory other than the flash memory mentioned above. Any memory that can store data, such as an SRAM (Static Random Access Memory), a DRAM (Dynamic RAM), an MRAM (Magnetoresistive RAM), or an EPROM (Erasable and Programmable Read Only Memory), may be used appropriately. Although the present embodiment has provided a controller which is separate and distinct from the semiconductor memory, the two and peripheral parts may also be embedded appropriately in a semiconductor.

The controller 4 reads a program, data, and the like stored in the data storage medium 8 based on an operating program and gives an instruction to perform a specified process, a data write operation, or the like. The external power supply circuit 5, the external power supply monitor circuit 6, the clock generator element 7, and the like are externally connected to the controller 4.

The external power supply circuit 5 is composed of, e.g., a power supply IC and generates an internal power supply voltage Vdd1 from a power supply voltage VCC supplied from the host 2 or the like. The external power supply monitor circuit 6 is a so-called reset IC which monitors an internal power supply voltage Vdd1 or an internal power supply voltage Vdd2, which will be described later, and generates a reset signal when a voltage reaches a given level or lower.

The clock generator element 7 is composed of, e.g., a crystal oscillator which generates a clock signal serving as a system clock for the controller 4 and supplies the generated clock signal to a control circuit (control unit, memory sensor unit) 9.

The controller 4 is composed of the control circuit 9, the internal power supply circuit (internal analog module) 10, an internal power supply monitor circuit (internal analog module) 11, a self-excited oscillator circuit (internal analog module, internal clock oscillator circuit) 12, switching elements 13 to 15, and the like. The internal power supply circuit 10, the internal power supply monitor circuit 11, and the self-excited oscillator circuit 12 constitute an internal analog module provided in the controller 4.

The control circuit 9 administers all control operations in the controller 4. The internal power supply circuit 10 generates the internal power supply voltage Vdd2 from the power supply voltage VCC supplied from the host 2 or the like. The internal power supply monitor circuit 11 monitors the internal power supply voltage Vdd1 or the internal power supply voltage Vdd2 and generates a reset signal when a voltage reaches a given level or lower. The self-excited oscillator circuit 12 generates the clock signal at a given frequency and supplies the generated clock signal as the system clock to the control circuit 9.

The internal power supply voltage Vdd1 and the internal power supply voltage Vdd2 are connected to the switching element 13 to be inputted thereto. The switching element 13 selectively outputs either one of the internal power supply voltage Vdd1 and the internal power supply voltage Vdd2 and supplies the internal power supply voltage Vdd1 or Vdd2 as an internal power supply voltage Vdd to the external power supply monitor circuit 6, the internal power supply monitor circuit 11, the data storage medium 8, the control circuit 9, and the like.

The external power supply monitor circuit 6 and the internal power supply monitor circuit 11 are connected to the switching element 14. The switching element 14 selects either of the reset signal outputted from the external power supply monitor circuit 6 and the reset signal outputted from the internal power supply monitor circuit 11 and outputs the selected reset signal to the control circuit 9.

The clock generator element 7 and the self-excited oscillator circuit 12 are connected to the switching element 15. The switching element 15 selects either of the clock signal outputted from the clock generator element 7 and the clock signal outputted from the self-excited oscillator circuit 12 and outputs the selected clock signal as a clock signal CLK to the control circuit 9.

FIG. 2 is an illustrative view showing a schematic layout of external connection terminals in the controller 4.

As shown in the drawing, the controller 4 comprises a host address bus terminal, a host data bus terminal, a host control bus terminal, a data storage medium address/data bus terminal, a data storage medium control bus terminal, analog module dedicated terminals, analog module control terminals, a terminal for temperature sensor circuit, and the like.

The host address bus terminal, the host data bus terminal, and the host control bus terminal are terminals used to access the host 2 by using an address signal, a data signal, and a control signal.

The data storage medium address/data bus terminal and the data storage medium control bus terminal are terminals used to access the data storage medium 8 by using address/data signals and a control signal.

The analog module dedicated terminals comprises: a terminal connected to the external module including the external power supply circuit 5, the external power supply monitor circuit 6, and the clock generator element 7; and a terminal which is necessary when the internal module including the internal power supply circuit 10, the internal power supply monitor circuit 11, and the self-excited oscillator circuit 12 is used. The analog module control terminals are terminals to which select control signals C1 to C3 used to control the switching elements 13 to 15 are inputted.

The terminal for temperature sensor circuit is a terminal connected to a temperature sensor circuit 3a (see FIG. 24) for measuring the temperature of an atmosphere in the semiconductor data storage apparatus 3.

A description will be given next to the function of the data processing system 1 according to the present embodiment.

FIG. 3 is an illustrative view showing an example when the switching elements 13 to 15 provided in the controller 4 of the data processing system 1 are composed of fuses (fuse elements) F1 to F6.

In this case, in the switching element 13 composed of the fuses F1 and F2, one connecting portion of the fuse 1 is connected to the external power supply circuit 5 and one connecting portion of the fuse F2 is connected to the other connecting portion of the fuse F1, while the other connecting portion of the fuse F2 is connected to the internal power supply circuit 10, as shown in the drawing.

The connecting portion between the fuses F1 and F2 serves as the output portion of the switching element 13, which is connected to each of the external power supply monitor circuit 6, the internal power supply monitor circuit 11, the data storage medium 8, the control circuit 9, and the like.

In the switching element 14 composed of the fuses F3 and F4, one connecting portion of the fuse F3 is connected to the external power supply monitor circuit 6 and one connecting portion of the fuse F4 is connected to the other connecting portion of the fuse F3, while the other connecting portion of the fuse F4 is connected to the internal power supply monitor circuit 11.

The connecting portion between the fuses F3 and F4 is the output portion of the switching element 14, which is connected to each of the control circuit 9 and the self-excited oscillator circuit 12.

In the switching element 15 composed of the fuses F5 and F6, one connecting portion of the fuse F5 is connected to the clock generator element 7 and one connecting portion of the fuse F6 is connected to the other connecting portion of the fuse F5, while the other connecting portion of the fuse F6 is connected to the self-excited oscillator circuit 12. The connecting portion between the fuses F5 and F6 is the output portion of the switching element 15, which is connected to the control circuit 9.

By disconnecting these fuses F1 to F6, switching is performed between the external analog module which is composed of the external power supply circuit 5, the external power supply monitor circuit 6, and the clock generator element 7, and the internal analog module which is composed of the internal power supply circuit 10, the internal power supply monitor circuit 11, and the self-excited oscillator circuit 12.

For example, when the internal power supply voltage Vdd1 generated by the external power supply circuit 5 is supplied to the controller 4 and the data storage medium 8, the fuse F2 is disconnected, while the fuse F1 is left in the connected state. Likewise, when the external power supply monitor circuit 6 is to be selected, the external power supply monitor circuit 6 is selected by disconnecting the fuse F4. When the self-excited oscillator circuit 12 is to be selected, the self-excited oscillator circuit 12 is selected by disconnecting the fuse F5.

By thus disconnecting an arbitrary one of the fuses F1 to F6, each of the external analog module and the internal analog modules can be used selectively in accordance with a purpose by selecting the external power supply circuit 5, the external power supply monitor circuit 6, and the clock generator element 7 to make provisions for a large current if the semiconductor data storage apparatus 3 is in, e.g., a high-value-added version which allows a high-speed data access thereto using an interleave operation or by using the internal power supply circuit 10, the internal power supply monitor circuit 11, and the self-excited oscillator circuit 12 if the semiconductor data storage apparatus 3 is in, e.g., a low-price version which does not use the interleave operation.

Accordingly, the same controller 4 can be used successfully even when either of the external analog module and the internal analog module is used. This achieves significant reductions in manufacturing cost and production management cost.

FIG. 4 is an illustrative view showing an example when the switching elements 13 to 15 provided in the controller 4 in the data processing system 1 are composed of selectors S1 to S3.

In this case, as shown in the drawing, the selector S1 composing the switching element 13 has one input portion connected to the external power supply circuit 5 and the other input portion connected to the internal power supply circuit 10.

The selector S1 performs switching between output signals (the internal power supply voltages Vdd1 and Vdd2) based on the select control signal C1 inputted via the analog module control terminal provided in the controller 4.

The selector S2 composing the switching element 14 has one input portion connected to the external power supply monitor circuit 6 and the other input portion connected to the internal power supply monitor circuit 11.

The selector S2 selects either of the external power supply monitor circuit 6 and the internal power supply monitor circuit 11 based on the select control signal C2 inputted via the analog module control terminal and connects the selected circuit.

The selector S3 composing the switching element 15 has one input portion connected to the clock generator element 7 and the other input portion connected to the self-excited oscillator circuit 12.

The selector S3 selects either of the clock generator element 7 and the self-excited oscillator circuit 12 based on the select control signal C3 inputted via the analog module control terminal and connects the selected element or circuit.

A description will be given to an operating process in the controller 4 provided with the selectors S1 to S3 with reference to the flow chart of FIG. 5.

First, when the power supply is turned ON (Step S101), the selector S1 recognizes the voltage level ('0' or '1') of the select control signal C1 (Step S102). When the select control signal C1 is '1', the selector S1 performs switching such that the internal power supply voltage Vdd1 generated by the external power supply circuit 5 is outputted (Step S103).

When the select control signal C1 is '0' in the process of Step S102, on the other hand, the selector S1 performs switching such that the internal power supply voltage Vdd2 generated by the internal power supply circuit 10 is outputted (Step S104).

Subsequently, the selector S2 recognizes the voltage level of the select control signal C2 (Step S105). When the select control signal C2 is '1', the selector S2 performs switching such that the external power supply monitor circuit 6 is connected (Step S106). When the select control signal C2 is '0', the selector S2 performs switching such that the internal power supply monitor circuit 11 is connected (Step S107).

Then, the selector S3 recognizes the voltage level of the select control signal C3 (Step S108). When the select control signal C3 is '1', the selector S3 performs switching such that the clock signal generated by the clock generator element 7 is outputted (Step S109). When the select control signal C3 is '0', the selector S3 performs switching such that the clock signal generated by the self-excited oscillator circuit 12 is outputted (Step S110). The switching process performed by the controller 4 is thus ended.

FIG. 6 is a view illustrating the controller 4 when the internal analog module (the internal power supply circuit 10, the internal power supply monitor circuit 11, and the self-excited oscillator circuit 12) is selected.

As shown in the drawing, the power supply voltage VCC supplied from the host 2 is inputted to the internal power supply circuit 10 via the analog module dedicated terminal. Likewise, the internal power supply voltage Vdd2 (FIG. 1) generated by the internal power supply circuit 10 is supplied to the data storage medium 8 via the analog module dedicated terminal.

FIG. 7 is a view illustrating the processing of the select control signals C1 to C3 at the analog module dedicated terminals.

As shown in the drawing, when each of the select control signals C1 to C3 is '1', the external power supply circuit 5, the external power supply monitor circuit 6, and the clock generator element 7 are selected. When each of the select control signals C1 to C3 is '0', the internal power supply circuit 10, the internal power supply monitor circuit 11, and the self-excited oscillator circuit 12 are selected.

The setting of each of the select control signals C1 to C1 to '1' or '0' is made by connecting the corresponding one of the analog module control terminals to the internal power supply voltage Vdd or to a reference voltage VSS using bonding options.

FIG. 8 is a view illustrating the controller 4 when the external analog module (the external power supply circuit 5, the external power supply monitor circuit 6, and the clock generator element 7) is selected.

In this case, the external power supply circuit 5 generates the internal power supply voltage Vdd1 (FIG. 1) from the power supply voltage VCC supplied from the host 2. This provides the structure in which the external power supply circuit 5, the external power supply monitor circuit 6, and the clock generator element 7 are connected to the controller 4 via the analog module dedicated terminals.

In this case also, the same controller 4 can be used successfully by providing the selectors S1 to S3 even when either of the external analog module and the internal analog module is used. This achieves significant reductions in manufacturing cost and production management cost.

FIG. 9 is an illustrative view showing an example when the control circuit 9 in the data processing system 1 automatically senses the number of the data storage media 8 in connection and performs switching between the internal analog module and the external analog module based on the result of sensing.

In this case, the switching elements 13 to 15 are composed of the selectors S1 to S3 and the connecting configuration thereof is also the same as in FIG. 4, as shown in the drawing. A different point is that the selectors S1 to S3 are connected to receive control signals CC1 to CC3 outputted from the control circuit 9.

A description will be given to an operating process in the controller 4 with reference to the flow chart of FIG. 10.

First, when the power supply is turned ON (Step S201), the controller 4 selects the internal analog module (the internal power supply circuit 10, the internal power supply monitor circuit 11, and the self-excited oscillator circuit 12) (Step S202). Although an exemplary case has been described where the controller 4 selects the internal analog module in the default state upon the turning ON of the power supply in this process of Step S202, it is also possible for the controller 4 to select the external analog module upon the turning ON of the power supply. Alternatively, the default state may also be set appropriately by using the select control signals C1 to C3 inputted via the analog module dedicated terminals described above.

Then, the control circuit 9 reads data from, e.g., the data storage media 8 and senses the number of the data storage media 8 in connection (Step S203). In this process of Step S203, the number of the data storage media 8 in connection is sensed by, e.g., reading a data table stored in each of the data storage media 8 therefrom to read data in a reset process and checking the status, checking the register, and reading the maker and the type specific code.

Subsequently, the controller 4 judges whether or not the sensed number of the data storage media 8 is N or larger (Step S204). If the number is N or more, the controller 4 outputs the control signals CC1 to CC3 to the selectors S1 to S3 and selects the external analog module (Step S205).

If the sensed number of the data storage media 8 is smaller than N, the controller 4 outputs the control signals CC1 to CC3 to the selectors S1 to S3 such that the internal analog module is selected (Step S206). By the foregoing operation, the selection process performed by the controller 4 is ended.

As a result, automatic switching can optimally be performed between the external analog module and the internal analog module depending on the number of the data storage media 8 in connection.

FIG. 11 is an illustrative view showing an exemplary case where the controller 4 in the data processing system 1 controls the switching of the selectors S1 to S3 depending on the current level of the internal power supply voltage Vdd.

In this case, a different point from the data processing system 1 of FIG. 4 is that a current sensor circuit (current sensor unit) 9a for sensing the current level of the internal power supply voltage Vdd is newly provided in the control circuit 9, as shown in the drawing. In addition, the connection of the selectors S1 to S3 is controlled by using the control signals CC1 to CC3 outputted from the control circuit 9 in the same manner as in FIG. 9.

FIG. 12 is an illustrative view showing an exemplary case where the controller 4 in the data processing system 1 controls the switching of the selectors S1 to S3 depending on the voltage level of the internal power supply voltage Vdd.

In this case, a different point from the data processing system 1 of FIG. 11 is that a voltage sensor circuit (voltage sensor unit) 9b is newly provided in the control circuit 9. The voltage sensor circuit 9b judges whether or not the voltage level of the internal power supply voltage Vdd is higher than a threshold voltage VDET.

FIG. 13 is an illustrative view showing an exemplary case where the controller 4 in the data processing system 1 controls the switching of the selectors S1 to S3 depending on the current level of the power supply voltage VCC supplied from the host 2. A different point from the data processing system 1 of FIG. 11 is that a current sensor circuit (current sensor unit) 9c for sensing the current level of the power supply voltage VCC is newly provided in the control circuit 9.

FIG. 14 is an illustrative view showing an exemplary case where the controller 4 in the data processing system 1 controls the switching of the selectors S1 to S3 depending on the voltage level of the power supply voltage VCC supplied from the host 2. A different point from the data processing system 1 of FIG. 11 is that a voltage sensor circuit (voltage sensor unit) 9d for sensing the voltage level of the power supply voltage VCC is newly provided in the control circuit 9. The voltage sensor circuit 9d judges whether or not the voltage level of the power supply voltage VCC is higher than the threshold voltage VDET.

FIG. 15 is a timing chart showing an example of current-value/voltage-value fluctuations in the power supply voltage VCC after the turning ON of the power supply and in the internal power supply voltage Vdd.

FIG. 15 shows, in a descending order, the timings of the power supply voltage VCC, the internal power supply voltage Vdd, sensing results from the voltage sensor circuits 9b and 9d, a reset signal/RESET inputted to the controller 4, and respective signals for the currents Icc/Idd of the power supply voltage VCC and the internal power supply voltage Vdd.

When the power supply is turned ON and each of the power supply voltage VCC and the internal power supply voltage Vdd becomes higher than the threshold voltage VDET, '1' is outputted from each of the voltage sensor circuits 9b and 9d. Then, the control circuit 9 makes an initial access to the data storage medium 8 in a reset process after power-on reset cancellation in the semiconductor data storage apparatus 3 and reads ID data, firmware, and the like from the data storage medium 8. Then, the semiconductor data storage apparatus 3 notifies the host 2 that the status is a command prompt state.

The read operation in the initial access during the reset process causes great fluctuations in the power supply voltage VCC, the internal power supply voltage Vdd, the current Icc, and the current Idd.

The voltage sensor circuits 9b and 9d sense the respective fluctuations in the power supply voltage VCC and the internal power supply voltage Vdd, whereby switching is performed between the external analog module and the internal analog module. The current sensor circuits 9a and 9c sense the respective fluctuations in the currents Icc and Idd, whereby switching is performed between the external analog module and the internal analog module.

Each of the current sensor circuits 9a and 9c is capable of preliminarily sensing a factor which causes a voltage drop so that reliability is enhanced. Each of the voltage sensor circuits 9b and 9d can be constructed in a relatively small scale so that cost is suppressed.

FIG. 16 is a flow chart showing a process in the controller 4 provided with the current sensor circuit 9a.

First, when the power supply is turned ON (Step S301), the controller 4 selects the internal analog module according to the default setting (Step S302). In this case also, the default state may be set such that the controller 4 selects the external analog module upon the turning ON of the power supply. Alternatively, the default state may also be set by using the select control signals C1 to C3 inputted via the analog module dedicated terminals mentioned above.

After the end of the power-on reset process, when the current sensor circuit 9 senses that the current of the internal power supply voltage Vdd becomes a threshold current or more in an initial access to the data storage medium 8 (Step S303), the current sensor circuit 9a outputs a sense signal to the control circuit 9.

Upon receipt of the sense signal, the control circuit 9 outputs the control signals CC1 to CC3 as '1' to the selectors S1 to S3 and performs a control operation for switching from the internal analog module to the external analog module (Step S304).

FIG. 17 is a flow chart showing a process in the controller 4 provided with the voltage sensor circuit 9b.

First, when the power supply is turned ON (Step S401), the controller 4 selects the internal analog module according to the default setting (Step S402). In this case also, the default state may be set such that the controller 4 selects the external analog module upon the turning ON of the power supply. Alternatively, the default state may also be set by using the select control signals C1 to C3 inputted via the analog module dedicated terminals mentioned above.

When the voltage sensor circuit 9b senses that the voltage level of the internal power supply voltage Vdd becomes the threshold voltage VDET or less in an initial access to the data storage medium 8 after the end of the power-on reset process (Step S403), the voltage sensor circuit 9b outputs a sense signal to the control circuit 9.

Upon receipt of the sense signal, the control circuit 9 outputs the control signals CC1 to CC3 as '1' to the selectors S1 to S3 and performs a control operation for switching from the internal analog module to the external analog module (Step S404).

FIG. 18 is a flow chart showing a process in the controller 4 provided with the current sensor circuit 9c.

First, when the power supply is turned ON (Step S501), the controller 4 selects the internal analog module according to the default setting (Step S502). In this case also, the default state may be set such that the external analog module is similarly selected upon the turning ON of the power supply. Alternatively, the default state may also be set by using the select control signals C1 to C3.

When the current sensor circuit 9c senses that the current of the power supply voltage VCC becomes the threshold current or more in an initial access to the data storage medium 8 after the end of the power-on reset process (Step S503), the current sensor circuit 9c outputs a sense signal to the control circuit 9.

Upon receipt of the sense signal, the control circuit 9 outputs the control signals CC1 to CC3 as '1' to the selectors S1 to S3 and performs a control operation for switching from the internal analog module to the external analog module (Step S504).

FIG. 19 is a flow chart showing a process in the controller 4 provided with the voltage sensor circuit 9d.

First, when the power supply is turned ON (Step S601), the controller 4 selects the internal analog module according to the default setting (Step S602). In this case also, the default state may be set such that the external analog module is selected or by using the select control signals C1 to C3 mentioned above.

When the voltage sensor circuit 9d senses that the voltage level of the power supply voltage VCC becomes the threshold voltage VDET or less in an initial access to the data storage medium 8 after the end of the power-on reset process (Step S603), the voltage sensor circuit 9d outputs a sense signal to the control circuit 9.

Upon receipt of the sense signal, the control circuit 9 outputs the control signals CC1 to CC3 as '1' to the selectors S1 to S3 and performs a control operation for switching from the internal analog module to the external analog module (Step S604).

Although a case has been shown in FIGS. 16 to 19 where the power supply voltage VCC, the internal power supply voltage Vdd, the current Icc or the current Idd is sensed in the initial access during the reset process, it is also possible to sense any of the power supply voltage VCC, the internal power supply voltage Vdd, the current Icc, and the current Idd during a normal operation after the end of the reset process and perform switching between the internal analog module and the external analog module.

This enables flexible measures to be taken such as using the internal analog module during the normal operation consuming less current and using the external analog module when the interleave operation of the plurality of data storage media 8 requires larger power consumption. Accordingly, the reliability can be enhanced, while the power consumption of the semiconductor data storage apparatus 3 can be reduced.

FIG. 20 is an illustrative view showing an exemplary case where the controller 4 in the data processing system 1 controls the switching of the selectors S1 to S3 based on a command issued from the host 2.

In this case, the settings for controlling the switching of the selectors S1 to S3 are stored in a register 9e provided in the control circuit 9.

FIG. 21 is a flow chart showing the operation of the data processing system 1 which controls the switching of the selectors S1 to S3 based on the command.

When the power supply is turned ON (Step S701), the controller 4 selects the internal analog module according to the default setting (Step S702). The default state may also be set herein such that the controller 4 selects the external analog module upon the turning ON of the power supply. Alternatively, the default state may also be set by using the select control signals C1 to C3 inputted via the analog module dedicated terminals mentioned above.

Then, the host 2 issues a command by setting the register 9e of the control circuit 9 in response to a command request from the semiconductor data storage apparatus 3 (Step S703). By thus writing data on the switching control directly in the register 9e of the controller 4, the switching of the selectors S1 to S3 can be performed with higher-speed timing.

Subsequently, the control circuit 9 outputs the control signals CC1 to CC3 based on the command set to the register 9e and controls the switching of the selectors S1 to S3 (Step S704).

FIG. 22 is a view illustrating the data processing system 1 in which the host 2 directly controls the switching of the selectors S1 to S3.

As shown in the drawing, connection is provided such that the control signals CC1 to CC3 for controlling the switching of the selectors S1 to S3 are outputted directly from the host 2.

A description will be given to an operation in the data processing system 1 in this case with reference to the flow chart of FIG. 23.

When the power supply is turned ON (Step S801), the controller 4 selects the internal analog module according to the default setting (Step S802). In this case also, the default state may be set such that the controller 4 selects the external analog module upon the turning ON of the power supply. Alternatively, the default state may also be set by using the select control signals C1 to C3 inputted via the analog module dedicated terminals mentioned above.

Subsequently, the host 2 outputs the control signals CC1 to CC3 to the selectors S1 to S3 and performs the switching of the selectors S1 to S3 (Step S803).

FIG. 24 is a view illustrating the data processing system 1 in which the switching of the selectors S1 to S3 is controlled based on the temperature of an atmosphere in the semiconductor data storage apparatus 3.

As shown in the drawing, the semiconductor data storage apparatus 3 is provided with a temperature sensor circuit 3a. The temperature sensor circuit 3a senses the temperature of the atmosphere in the semiconductor data storage apparatus 3. The temperature sensor circuit 3a is connected to output the sensed temperature to the control circuit 9 via the terminal for temperature sensor circuit (FIG. 2).

A description will be given to the operation of the data processing system 1 provided with the temperature sensor circuit 3a with reference to the flow chart of FIG. 25.

First, when the power supply is turned ON (Step S901), the controller 4 selects the internal analog module according to the default setting (Step S902). The default state may also be set herein such that the controller 4 selects the external analog module upon the turning ON of the power supply. Alternatively, the default state may also be set by using the select control signals C1 to C3 inputted via the analog module dedicated terminals mentioned above.

Thereafter, the temperature sensor circuit 3a monitors the temperature of the atmosphere in the semiconductor data storage apparatus 3 and outputs the monitored temperature to the control circuit 9. The control circuit 9 judges whether the inputted sensed temperature is not less than a first specified value (e.g., about 60° C.) or not more than a second specified value (e.g., about 0° C.) (Step S903).

When the sensed temperature becomes not less than the first specified value or not more than the second specified value, the control circuit 9 outputs the control signals CC1 to CC3 to the selectors S1 to S3 and performs a control operation for switching to the external analog module (Step S904).

By thus monitoring the temperature of the atmosphere in the semiconductor data storage apparatus 3 and controlling the switching between the external analog module and the internal analog module, the reliability of the semiconductor data storage apparatus 3 can be enhanced.

Accordingly, the present embodiment can use the common controller 4 to support the external analog module and the internal analog module and significantly reduce the manufacturing cost and the production management cost.

Although the invention achieved by the present inventors has been described specifically with reference to the embodiments thereof, the present invention is not limited thereto. It will be understood that various changes and modifications can be made in the invention without departing from the gist thereof.

A technology for controlling the switching of an analog module according to the present invention is suitable for a technology for reducing production cost for a semiconductor data storage apparatus.

What is claimed is:

1. A semiconductor data storage apparatus comprising:
   one or more semiconductor memories;
   an external analog module comprised of at least one of an external power supply circuit, an external clock oscillator circuit, and an external power supply monitor circuit; and
   a data processing unit connected externally to said external analog module,
   wherein said data processing unit is capable of controlling, based on arbitrary one of operating programs, reading data stored in said one or more semiconductor memories, performing a specified process, and writing a data to one of said one or more semiconductor memories, and
   wherein said data processing unit includes:
   an internal analog module corresponding to said external analog module and comprised of at least one of an internal power supply circuit, an internal clock oscillator circuit, and an internal power supply monitor circuit,
   a switching element for making enable/disable settings for said internal analog module and said external analog module,
   a memory sensor unit for sensing the number of said semiconductor memories in connection, and
   a control unit for judging whether the number of said semiconductor memories sensed by said memory sensor unit is larger or smaller than a reference value and outputting, when the number of said semiconductor memories is larger than the reference value, a control signal which enables said external analog module to said switching element.

2. A semiconductor data storage apparatus according to claim 1, wherein said data processing unit comprises:
   a current sensor circuit for sensing a current value of any one of an internal power supply voltage and a power supply voltage supplied from a data processing apparatus for managing said semiconductor data storage apparatus; and
   a control unit for judging whether or not the current value sensed by said current sensor circuit is equal to or more than a reference value and outputting, when the sensed current value is equal to or more than the reference value, a control signal which enables said external analog module to said switching element.

3. A semiconductor data storage apparatus according to claim 1, wherein said data processing unit comprises:
   a voltage sensor circuit for sensing a voltage level of any one of an internal power supply voltage and a power supply voltage supplied from a data processing apparatus for managing said semiconductor data storage apparatus; and a control unit for judging whether or not the voltage level sensed by said voltage sensor circuit is equal to or more than a reference voltage level and outputting, when the sensed voltage level is equal to or less than the reference voltage level, a control signal which enables said external analog module to said switching element.

4. A semiconductor data storage apparatus comprising:

one or more semiconductor memories;

an external analog module comprised of at least one of an external power supply circuit, an external clock oscillator circuit, and an external power supply monitor circuit; and a data processing unit connected externally to said external analog module, wherein said data processing unit is capable of controlling, based on arbitrary one of operating programs, reading data stored in said one or more semiconductor memories, performing a specified process, and writing a data to one of said one or more semiconductor memories, and wherein said data processing unit includes:

an internal analog module corresponding to said external analog module and comprised of at least one of an internal power supply circuit, an internal clock oscillator circuit, and an internal power supply monitor circuit, a switching element for making enable/disable settings for said internal analog module and said external analog module, and a control unit for controlling the switching of said switching element based on a command issued from a data processing apparatus being coupled with outside of said semiconductor data storage apparatus, and wherein said switching element makes the enable/disable settings for said internal analog module and said external analog module based on a control signal outputted from said control unit.

5. A semiconductor data storage apparatus comprising:

one or more semiconductor memories;

an external analog module; and a data processing unit connected externally to said external analog module, wherein said data processing unit is capable of controlling, based on arbitrary one of operation programs, reading data stored in said one or more semiconductor memories, performing a specified process, and writing data to one of the one or more semiconductor memories, wherein said data processing unit includes:

an internal analog module corresponding to said external analog module; and a switching element for making enable/disable settings for said internal analog module and said external analog module, and wherein said switching element controls switching between the enable/disable settings depending on an operating mode of each of said semiconductor memories.

6. A semiconductor data storage apparatus according to claim 5, wherein said external analog module is comprised of at least one of an external power supply circuit, an external clock oscillator circuit, and an external power supply monitor circuit, and wherein said internal analog module is comprised of at least one of an internal power supply circuit, an internal clock oscillator circuit, and an internal power supply monitor circuit.

7. A semiconductor data storage apparatus according to claim 6, wherein said switching element enables said external analog module when said one or more semiconductor memories are performing an interleave operation and enables said internal analog module when said one or more semiconductor memory are not performing the interleave operation.

8. A semiconductor data storage apparatus according to claim 6, wherein said data processing unit comprises:

a control unit for controlling the switching of said switching element based on a command issued from a data processing apparatus being coupled with outside of said semiconductor data storage apparatus, and wherein said switching element makes enable/disable settings for said internal analog module and said external analog module based on a control signal outputted from said control unit.

9. A semiconductor data storage apparatus according to claim 6, wherein said switching element makes enable/disable settings for said internal analog module and said external analog module based on a control signal outputted from a data processing apparatus being coupled with outside of said semiconductor data storage apparatus.

10. A semiconductor data storage apparatus according to claim 5, wherein said data processing unit comprises:

a memory sensor unit for sensing the number of said one or more semiconductor memories in connection; and a control unit for judging whether the number of said one or more semiconductor memories sensed by said memory sensor unit is larger or smaller than a reference value and outputting, when the number of said one or more semiconductor memories is larger than the reference value, a control signal which enables said external analog module to each of said first to third switching elements.

* * * * *